United States Patent
Patel et al.

(10) Patent No.: US 10,776,293 B2
(45) Date of Patent: Sep. 15, 2020

(54) DDR5 RCD INTERFACE PROTOCOL AND OPERATION

(71) Applicant: Integrated Device Technology, Inc., San Jose, CA (US)

(72) Inventors: Shwetal Arvind Patel, San Jose, CA (US); Andy Zhang, San Jose, CA (US); Wen Jie Meng, San Jose, CA (US); Chenxiao Ren, Fremont, CA (US); Alejandro F. Gonzalez, Johns Creek, GA (US)

(73) Assignee: Integrated Device Technology, Inc., San Jose, CA (US)

( * ) Notice: Subject to any disclaimer, the term of this patent is extended or adjusted under 35 U.S.C. 154(b) by 136 days.

(21) Appl. No.: 15/967,823

(22) Filed: May 1, 2018

(65) Prior Publication Data

US 2019/0340141 A1    Nov. 7, 2019

(51) Int. Cl.
*G06F 3/00* (2006.01)
*G06F 13/16* (2006.01)
*G06F 3/06* (2006.01)
*G06F 1/10* (2006.01)

(52) U.S. Cl.
CPC ............ *G06F 13/1689* (2013.01); *G06F 1/10* (2013.01); *G06F 3/0604* (2013.01); *G06F 3/0625* (2013.01); *G06F 3/0659* (2013.01); *G06F 3/0673* (2013.01); *G06F 2213/0016* (2013.01)

(58) Field of Classification Search
CPC ............................ Y02D 10/14; G06F 12/0246

USPC .......................................................... 710/48
See application file for complete search history.

(56) References Cited

U.S. PATENT DOCUMENTS

| | | | |
|---|---|---|---|
| 9,502,082 B1 * | 11/2016 | Dang | G11C 5/147 |
| 2008/0037353 A1 * | 2/2008 | Rajan | G11C 5/04 365/227 |
| 2010/0257304 A1 * | 10/2010 | Rajan | G11C 5/14 711/6 |
| 2011/0231587 A1 * | 9/2011 | Andersson | G06F 13/385 710/107 |
| 2011/0283117 A1 * | 11/2011 | Krig | G06F 1/206 713/300 |
| 2015/0294698 A1 * | 10/2015 | Takefman | G11C 5/04 365/189.05 |
| 2016/0349817 A1 * | 12/2016 | Kumar | G06F 1/30 |

* cited by examiner

*Primary Examiner* — Titus Wong
(74) *Attorney, Agent, or Firm* — Christopher P. Maiorana, PC

(57) ABSTRACT

An apparatus including a host interface and a registered clock driver interface. The host interface may be configured to receive an enable command from a host. The registered clock driver interface may be configured to perform power management for a dual in-line memory module, generate data for the dual in-line memory module, communicate the data, receive a clock signal and communicate an interrupt signal. The registered clock driver interface may be disabled at power on. The registered clock driver interface may be enabled by in response to the enable command. The apparatus may be implemented as a component on the dual in-line memory module.

20 Claims, 15 Drawing Sheets

US 10,776,293 B2

DDR5 RCD INTERFACE PROTOCOL AND OPERATION

FIELD OF THE INVENTION

The invention relates to memory generally and, more particularly, to a method and/or apparatus for implementing a DDR5 RCD interface protocol and operation.

BACKGROUND

Power management in conventional double data rate memory modules relies on discrete devices (i.e., a controller, voltage regulators, diodes and various passive components) implemented on a memory controller located on a host device (i.e., a motherboard). Power management performed by the memory controller would be shared for all of the memory modules. Conventional double data rate memory modules use of an I²C bus to report temperature sensor measurements to a host memory controller. Power measurements are not available for memory modules.

Integrating power measurement functionality into a single chip that is fully programmable would accommodate density scaling, power sequencing, voltage margining and storage class memory support. However, accessing power measurements on a conventional bus would be slow and can result in latency when there are bandwidth issues.

It would be desirable to implement a DDR5 RCD interface protocol and operation.

SUMMARY

The invention concerns an apparatus comprising a host interface and a registered clock driver interface. The host interface may be configured to receive an enable command from a host. The registered clock driver interface may be configured to perform power management for a dual in-line memory module, generate data for the dual in-line memory module, communicate the data, receive a clock signal and communicate an interrupt signal. The registered clock driver interface may be disabled at power on. The registered clock driver interface may be enabled by in response to the enable command. The apparatus may be implemented as a component on the dual in-line memory module.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a DDR5 RCD to PMIC interface protocol and operation that may (i) enable a power management integrated circuit to be implemented on each memory module, (ii) enable a memory controller to have access to power and current readings for each memory module, (iii) operate using an independent clock, (iv) provide a bi-directional interrupt, (v) reduce a latency of communicating power readings, (vi) reduce bandwidth on a system management bus, (vii) enable periodic polling, and/or (viii) be implemented as one or more integrated circuits.

Figure 1:
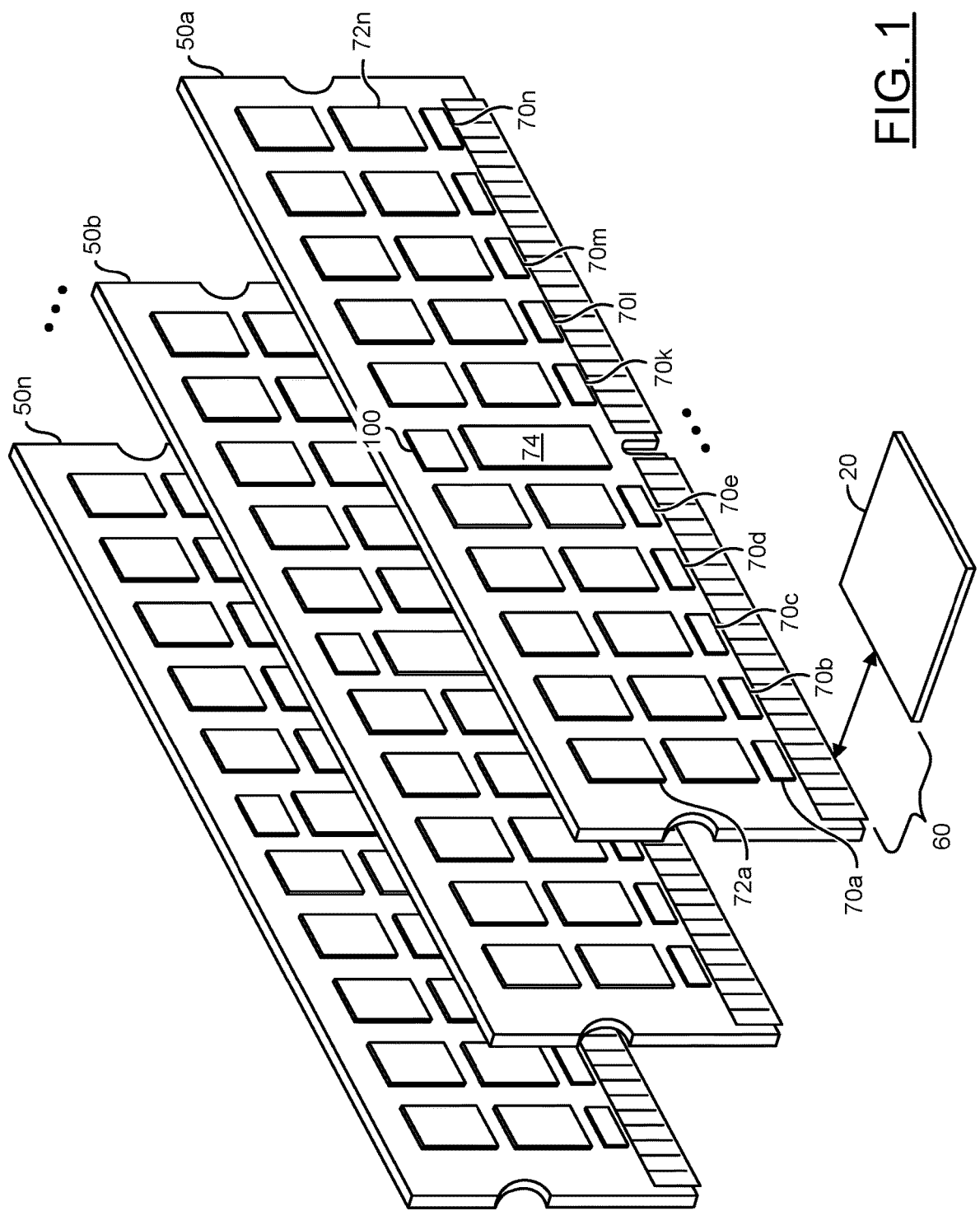
FIG. 1 is a diagram illustrating an example embodiment of a memory system.

Referring to FIG. 1, a diagram of a memory system is shown in accordance with an example embodiment of the invention. In various embodiments, the memory system includes a number of circuits 50a-50n. The circuits 50a-50n may be implemented as memory modules (or boards). In an example, the circuits 50a-50n may be implemented as dual in-line memory modules (DIMMs). In some embodiments, the circuits 50a-50n may be implemented as double data rate fourth generation (DDR4) synchronous dynamic random-access memory (SDRAM) modules. In some embodiments, the circuits 50a-50n may be implemented as double data rate fifth generation (DDR5) SDRAM modules.

In various embodiments, the circuits 50a-50n may comprise a number of blocks (or circuits) 70a-70n, a number of blocks (or circuits) 72a-72n, a block (or circuit) 74, a block (or circuit) 100 and/or various other blocks, circuits, pins, connectors and/or traces. The circuits 70a-70n may be configured as data buffers. The circuits 72a-72n may implement memory devices. In an example, the circuits 72a-72n may be implemented as synchronous dynamic random-access memory (SDRAM) devices (or chips, or modules). The circuit 74 may be implemented as a registered clock driver (RCD). In an example, the RCD circuit 74 may be implemented as a DDR4 RCD circuit. In another example, the RCD circuit 74 may be implemented as a RCD circuit compliant with the DDR5 standard. The circuit 100 may be implemented as a power management integrated circuit (PMIC). The type, arrangement and/or number of components of the memory modules 50a-50n may be varied to meet the design criteria of a particular implementation.

The memory modules 50a-50n are shown connected to a block (or circuit) 20. The circuit 20 may implement a memory controller. The circuit 20 may be located in another device, such as a computing engine. Various connectors/pins/traces 60 may be implemented to connect the memory modules 50a-50n to the memory controller 20. In some embodiments, the connectors/pins/traces 60 may be a 288-pin configuration. In an example, the memory controller 20 may be a component of a computer motherboard (or main board). In another example, the memory controller 20 may be a component of a microprocessor. In yet another example, the memory controller 20 may be a component of a central processing unit (CPU).

In an example, some of the connectors/pins/traces 60 may be part of the memory modules 50a-50n and some of the connectors/pins/traces 60 may be part of the motherboard and/or memory controller 20. The memory modules 50a-50n may be connected to the computer motherboard (e.g., by pins, traces and/or connectors 60) to transfer data between components of a computing device and the memory modules 50a-50n. In some embodiments, the connectors/pins/traces 60 may implement an 80-bit bus. In an example, the memory controller 20 may be implemented on a northbridge of the motherboard and/or as a component of a microprocessor (e.g., an Intel CPU, an AMD CPU, an ARM CPU, etc.). The implementation of the memory controller 20 may be varied according to the design criteria of a particular implementation.

In various embodiments, the circuits 50a-50n may be implemented as DDR4 (or DDR5) SDRAM memory modules. In an example, the circuits 50a-50n may have a memory module density of 512 gigabyte (GB), one terabyte (TB), or higher per module (e.g., compared to 128 GB per dual in-line memory module (DIMM) in DDR3). In embodiments implementing DDR4 SDRAM memory modules, the circuits 50a-50n may operate at voltages of 1.2-1.4 volts (V) with a frequency between 800-4266 megahertz (MHZ) (e.g., compared to 1.5-1.65V at frequencies between 400-1067 MHZ in DDR3). In embodiments implementing DDR5 standard SDRAM memory modules, the circuits 50a-50n may operate with a frequency of 4.4 GHz, 6.6 GHz and/or higher frequencies. In embodiments implementing DDR5 standard SDRAM memory modules, there may be 5 memory modules on each side of the RCD 74. In some embodiments, the circuits 50a-50n may be implemented as low voltage DDR4 memory modules and operate at 1.05V. For example, in embodiments implementing low voltage DDR4 SDRAM memory modules, the circuits 50a-50n may implement 35% power savings compared to DDR3 memory. In embodiments implementing DDR4 SDRAM memory modules, the circuits 50a-50n may transfer data at speeds of 2.13-4.26 giga-transfers per second (GT/s) and higher (e.g., compared to 0.8-2.13 GT/s in DDR3). The operating parameters of the memory modules 50a-50n may be varied according to the design criteria of a particular implementation.

In an example, the memory modules 50a-50n may be compliant with the DDR4 specification entitled "DDR4 SDRAM", specification JESD79-4A, November 2013, published by the Joint Electron Device Engineering Council (JEDEC) Solid State Technology Association, Arlington, Va. Appropriate sections of the DDR4 specification (e.g., the DDR4 JEDEC specification) are hereby incorporated by reference in their entirety. In another example, the memory modules 50a-50n may be implemented according to a fifth generation (DDR5) standard (e.g., for which a standard is currently under development by JEDEC). References to the DDR5 standard may refer to a latest working and/or draft version of the DDR5 specification published and/or distributed to committee members by JEDEC as of March 2018. Appropriate sections of the DDR5 standard are hereby incorporated by reference in their entirety.

In some embodiments, the memory modules 50a-50n may be implemented as DDR4 load reduced DIMM (LRDIMM). The data buffers 70a-70n may allow the memory modules 50a-50n to operate at higher bandwidth and/or at higher capacities compared to DDR4 RDIMM (e.g., 2400 or 2666 MT/s for DDR4 LRDIMM compared to 2133 or 2400 MT/s for DDR4 RDIMM at 384 GB capacity). For example, compared to DDR4 RDIMM configurations, the DDR4 LRDIMM configuration of the memory modules 50a-50n may allow improved signal integrity on data signals and/or better intelligence and/or post-buffer awareness by the memory controller 20.

Figure 2:
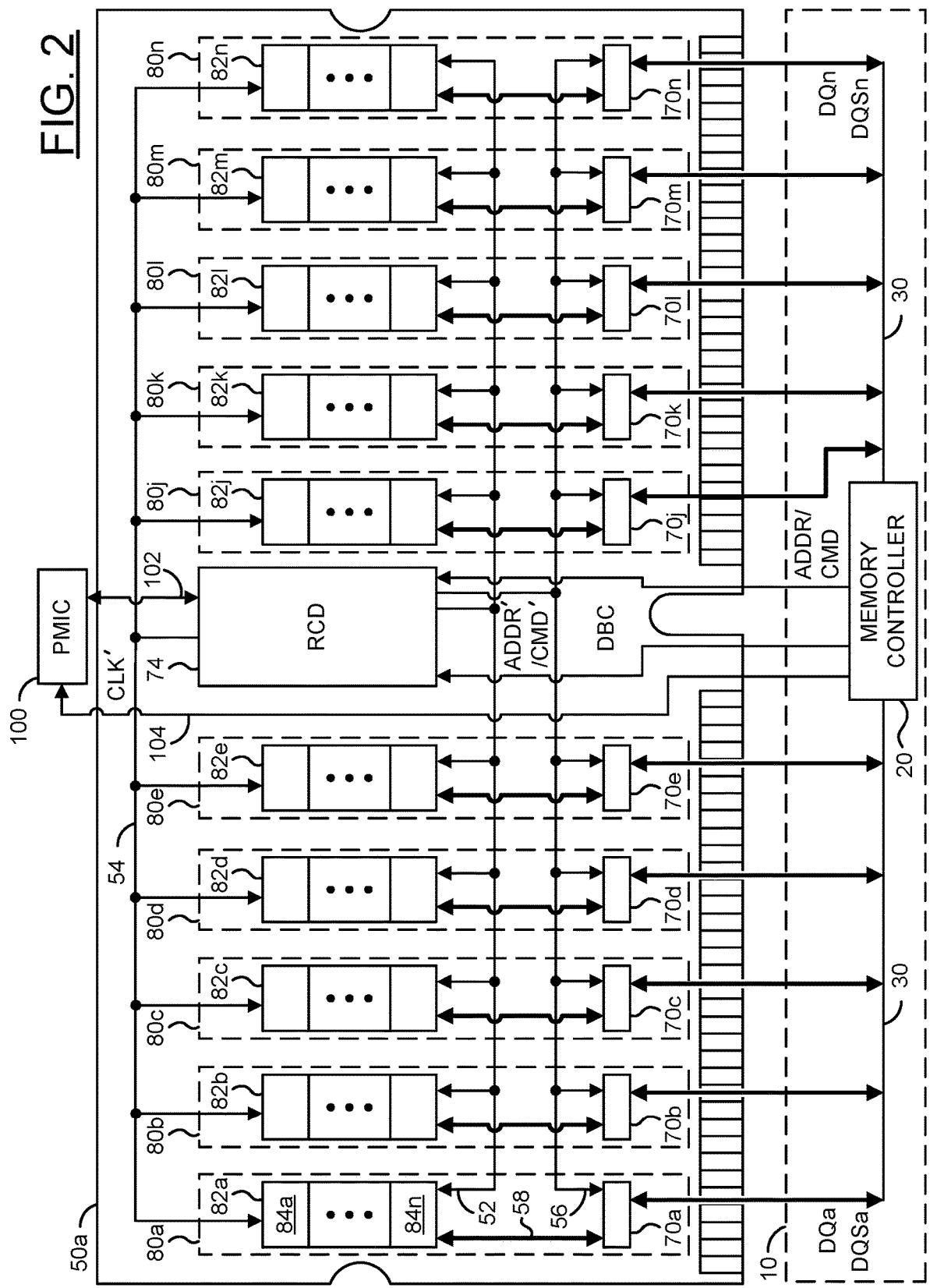
FIG. 2 is a block diagram illustrating a memory module of FIG. 1.

Referring to FIG. 2, a block diagram is shown illustrating a memory module 50a of FIG. 1. The memory module 50a may be representative of the memory modules 50b-50n. The memory module 50a is shown communicating with the memory controller 20. The memory controller 20 is shown as part of a block (or circuit) 10. The circuit 10 may be a motherboard (or main board), or other electronic component or computing engine that communicates with the memory module 50a.

The memory module 50a may comprise one or more blocks (or circuits) 80a-80n, the RCD circuit 74 and/or the PMIC 100. The circuits 80a-80n may implement data paths of the memory module 50a. For example, the data path 80a may include a block 82a and/or the data buffer 70a. The data paths 80b-80n may have similar implementations. In the example shown, the memory module 50a may comprise five data paths (e.g., 80a-80e) on one side of the RCD 74 and five data paths (e.g., 80j-80n) on another side of the RCD 74. The circuits 82a-82n may each be implemented as a memory channel. Each of the memory channels 82a-82n may comprise a number of blocks (or circuits) 84a-84n. The circuits 84a-84n may be implemented as random access memory (RAM) chips. For example, the RAM chips 84a-84n may implement a volatile memory such as dynamic RAM (DRAM). The RAM chips 84a-84n may be the SDRAM devices 72a-72n (e.g., the chips 84a-84n may comprise one or more of the circuits 72a-72n located within one of the memory channels 82a-82n). In some embodiments, the RAM chips 84a-84n may be physically located on both sides (e.g., the front and back) of the circuit board of the memory modules 50a-50n. A capacity of memory on the memory module 50a may be varied according to the design criteria of a particular implementation.

The memory controller 20 may generate a signal (e.g., CLK), a number of control signals (e.g., ADDR/CMD) and/or a number of commands. The signal CLK and/or the signals ADDR/CMD may be presented to the RCD circuit 74. The commands may be presented to the PMIC 100 via a bus 104. A data bus 30 may be connected between the memory controller 20 and the data paths 80a-80n. The memory controller 20 may generate and/or receive data signals (e.g., DQa-DQn) and data strobe signals (e.g. DQSa-DQSn) that may be presented/received from the data bus 30. Portions of the signals DQa-DQn and DQSa-DQSn may be presented to respective data paths 80a-80n.

The RCD circuit 74 may be configured to communicate with the memory controller 20, the data buffers 70a-70n, the memory channels 82a-82n and/or the PMIC 100. The RCD circuit 74 may decode instructions (e.g., control words) received from the memory controller 20. For example, the RCD circuit 74 may receive register command words (RCWs). In another example, the RCD circuit 74 may receive buffer control words (BCWs). The RCD circuit 74 may be configured to train the DRAM chips 84a-84n, the data buffers 70a-70n and/or command and address lines between the RCD circuit 74 and the memory controller 20. For example, the RCWs may flow from the memory controller 20 to the RCD circuit 74. The RCWs may be used to configure the RCD circuit 74.

The RCD circuit 74 may be used in both LRDIMM and RDIMM configurations. The RCD circuit 74 may implement a 32-bit 1:2 command/address register. The RCD circuit 74 may support an at-speed bus (e.g., a BCOM bus between the RCD circuit 74 and the data buffers 70a-70n). The RCD circuit 74 may implement automatic impedance calibration. The RCD circuit 74 may implement command/address parity checking. The RCD circuit 74 may control register RCW readback. In some embodiments, the RCD circuit 74 may implement a 1 MHz inter-integrated circuit ($I^2C$) bus (e.g., a serial bus). In some embodiments, the RCD circuit 74 may implement a 12.5 MHz inter-integrated circuit ($I^3C$) bus. Inputs to the RCD circuit 74 may be pseudo-differential using external and/or internal voltages. The clock outputs, command/address outputs, control outputs and/or data buffer control outputs of the RCD circuit 74 may be enabled in groups and independently driven with different strengths.

The RCD circuit 74 may receive the signal CLK and/or the signals ADDR/CMD from the memory controller 20. Various digital logic components of the RCD circuit 74 may be used to generate signals based on the signal CLK and/or the signals ADDR/CMD and/or other signals (e.g., RCWs). The RCD circuit 74 may also be configured to generate a signal (e.g., CLK') and signals (e.g., ADDR'/CMD'). For example, the signal CLK' may be a signal Y_CLK in the DDR4 specification. The signal CLK' and/or the signals ADDR'/CMD' may be presented to each of the memory channels 82a-82n. For example, the signals ADDR'/CMD' and CLK' may be transmitted on a common bus 52 and a common bus 54, respectively. The RCD circuit 74 may generate one or more signals (e.g., DBC). The signals DBC may be presented to the data buffers 70a-70n. The signals DBC may implement data buffer control signals. The signals DBC may be transmitted on a common bus 56 (e.g., a data buffer control bus).

The data buffers 70a-70n may be configured to receive commands and data from the bus 56. The data buffers 70a-70n may be configured to generate/receive data to/from the bus 30. The bus 30 may comprise traces, pins and/or connections between the memory controller 20 and the data buffers 70a-70n. A bus 58 may carry the data between each of the data buffers 70a-70n and respective memory channels 82a-82n. The data buffers 70a-70n may be configured to buffer data on the buses 30 and 58 for write operations (e.g., data transfers from the memory controller 20 to the corresponding memory channels 82a-82n). The data buffers 70a-70n may be configured to buffer data on the buses 30 and 58 for read operations (e.g., data transfers from the corresponding memory channels 82a-82n to the memory controller 20).

The data buffers 70a-70n may exchange data with the DRAM chips 84a-84n in small units (e.g., 4-bit nibbles). In various embodiments, the DRAM chips 84a-84n may be arranged in multiple (e.g., two) sets. For two set/two DRAM chip (e.g., 84a-84b) implementations, each set may contain a single DRAM chip (e.g., 84a or 84b). Each DRAM chip 84a-84b may be connected to the respective data buffers 70a-70n through an upper nibble and a lower nibble. For two set/four DRAM chip (e.g., 84a-84d) implementations, each set may contain two DRAM chips (e.g., 84a-84b or 84c-84d). A first set may be connected to the respective data buffers 70a-70n through the upper nibble. The other set may be connected to the respective data buffers 70a-70n through the lower nibble. For two set/eight DRAM chip (e.g., 84a-84h) implementations, each set may contain four of the DRAM chips 84a-84h. A set of four DRAM chips (e.g., 84a-84d) may connect to the respective data buffers 70a-70n through the upper nibble. The other set of four DRAM chips (e.g., 84e-84h) may connect to the respective data buffers 70a-70n through the lower nibble. Other numbers of sets, other numbers of DRAM chips, and other data unit sizes may be implemented to meet the design criteria of a particular implementation.

The DDR4 LRDIMM configuration may reduce a number of data loads to improve signal integrity on a data bus (e.g., the bus 30) of the memory module from a maximum of several (e.g., four) data loads down to a single data load. The distributed data buffers 70a-70n may allow DDR4 LRDIMM designs to implement shorter I/O trace lengths compared to DDR3 LRDIMM designs, which use a centralized memory buffer. For example, shorter stubs connected to the memory channels 82a-82n may result in less pronounced signal reflections (e.g., improved signal integrity). In another example, the shorter traces may result in a reduction in latency (e.g., approximately 1.2 nanoseconds (ns), which is 50% less latency than DDR3 buffer memory). In yet another example, the shorter traces may reduce I/O bus turnaround time. For example, without the distributed data buffers 70a-70n (e.g., in DDR3 memory applications) traces would be routed to a centrally located memory buffer, increasing trace lengths up to six inches compared to the DDR4 LRDIMM implementation shown in FIG. 2.

In some embodiments, the DDR4 LRDIMM configuration may implement nine of the data buffers 70a-70n. The memory modules 50a-50n may implement 2 millimeter (mm) frontside bus traces and backside traces (e.g., the connectors/pins/traces 60). A propagation delay through the data buffers 70a-70n may be 33% faster than through a DDR3 memory buffer (e.g., resulting in reduced latency). In some embodiments, the data buffers 70a-70n may be smaller (e.g., a reduced area parameter) than a data buffer used for DDR3 applications.

An interface 102 is shown. The interface 102 may be configured to enable communication between the RCD circuit 74 and the PMIC 100. For example, the interface 102 may implement a register clock driver/power management integrated circuit interface (e.g., a RCD-PMIC interface). The interface 102 may comprise one or more signals and/or connections. Some of the signals and/or connections implemented by the interface 102 may be unidirectional. Some of the signals and/or connections implemented by the interface 102 may be bidirectional. The interface 102 may be enabled by the host memory controller 20. In one example, the memory controller 20 may enable the interface 102 for the RCD using the signal ADDR/CMD. In another example, the memory controller 20 may enable the interface 102 for the PMIC 100 by presenting an enable command.

The bus 104 may be implemented as a host interface bus. The host interface bus 104 may be bi-directional. The host interface bus 104 may be configured to communicate commands and/or other data to the PMIC 100 and/or other components of the memory module 50a. In some embodiments, the bus 104 may communicate with the RCD 74. In some embodiments, the host interface bus 104 may implement an $I^2C$ protocol. In some embodiments, the host interface bus 104 may implement an $I^3C$ protocol. The protocol implemented by the host interface 104 may be varied according to the design criteria of a particular implementation.

Figure 3:
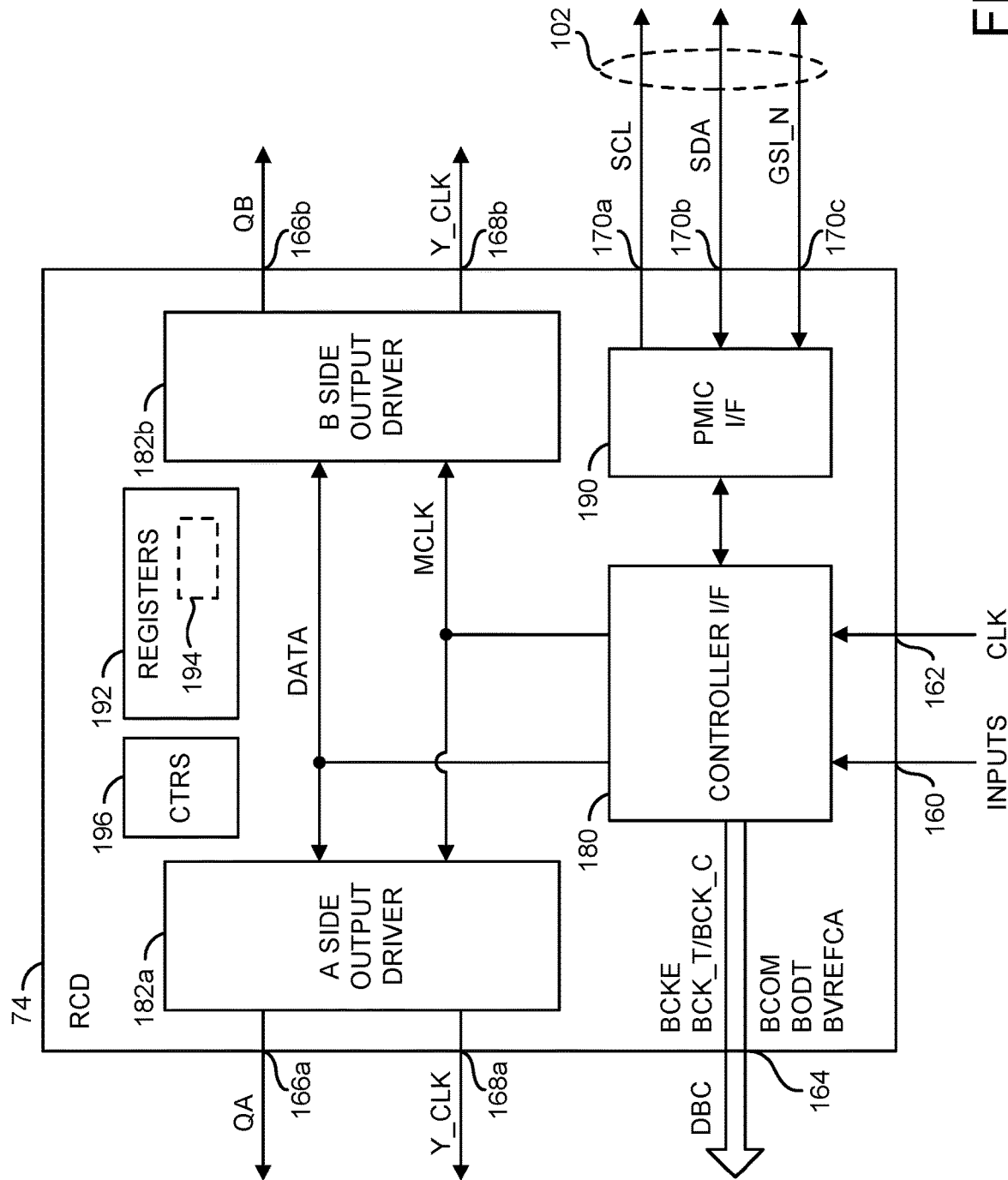
FIG. 3 is a diagram illustrating a registered clock driver (RCD) in accordance with an embodiment of the invention.

Referring to FIG. 3, a diagram is shown illustrating a registered clock driver in accordance with an embodiment of the invention. In various embodiments, a circuit 74 may implement a registered clock driver circuit (or chip). In various embodiments, the circuit 74 may be JEDEC compliant (e.g., compliant with the DDR4 specification entitled "DDR4 SDRAM", specification JESD79-4A, November 2013, published by the Joint Electron Device Engineering Council (JEDEC) Solid State Technology Association, Arlington, Va. and/or compliant with the DDR5 standard).

The circuit 74 may have an input 160 that receives input data (e.g., INPUTS), an input 162 that receives the clock signal CLK, an input/output 164 that may receive/transmit control information (e.g., DBC), outputs 166a and 166b that may provide data outputs (e.g., the Q outputs QA and QB, respectively), outputs 168a and 168b that may provide output clock signals (e.g., Y_CLK) and/or inputs/outputs 170a-170c that may send/receive data via the interface 102. The signals INPUTS and CLK may be received from a memory controller (e.g., the memory controller 20 in FIG. 1) via a memory bus of a motherboard. In an example, the signals INPUTS may be pseudo-differential using an external or internal voltage reference. The signals INPUTS may comprise the ADDR/CMD signals of FIGS. 1 and 2. In an example, the signal CLK may be implemented as differential clock signals CLK_t (true) and CLK_c (complement). The signals QA, QB, and Y_CLK may be presented to a number of memory chips (e.g., 84a-84n in FIG. 2). For example, the signals QA, QB and Y_CLK may implement an output address and control bus for a DDR4 RDIMM, DDR4 LRDIMM, DDR4 UDIMM and/or DDR5 memory module. The signal DBC may be implemented as a data buffer control bus.

The output 170a may present a signal (e.g., SCL). The input/output 170b may communicate a signal (e.g., SDA). The input/output 170c may communicate a signal (e.g., GSI_N). The signal SCL may be a clock signal. The signal SDA may be a data signal. For example, the signal SDA may communicate power data. The signal GSI_N may be an interrupt signal. The signal SDA and/or the signal GSI_N may be a bi-directional signal. The signal SCL, the signal SDA and/or the signal GSI_N may each be a portion of the information communicated using the RCD-PMIC interface 102. The number of signals, the number of connections and/or the type of data communicated using the RCD-PMIC interface 102 may be varied according to the design criteria of a particular implementation.

In various embodiments the circuit 74 may comprise a block 180, blocks (or circuits) 182a-182b, a block (or circuit) 190 a block (or circuit) 192 and/or a block (or circuit) 196. The block 180 may implement a controller interface. The blocks 182a and 182b may implement output driver circuits. In some embodiments, the blocks 182a and 182b may be combined as a single output driver circuit 182. The block 190 may implement a PMIC interface (or port) 190. The block 192 may implement register space. The block 196 may implement one or more counters. The RCD circuit 74 may comprise other components (not shown). The number, type and/or arrangement of the components implemented by the RCD 74 may be varied according to the design criteria of a particular implementation.

The block 180 may be configured to generate a data signal (e.g., DATA) and a clock signal (e.g., MCLK). The block 180 may be configured to generate the pair of signals (e.g., BCK_T/BCK_C), a signal (e.g., BCOM), a signal (e.g., BCKE), a signal (e.g., BODT) and/or a signal (e.g., BVREFCA). The signals DATA and MCLK may be presented to the blocks 182a and 182b. In various embodiments, the signal DATA may be coupled to the blocks 182a and 182b by combinatorial logic (not shown). The blocks 182a and 182b may be configured to generate the signals QA, QB and Y_CLK.

In various embodiments, the signals BCK_T/BCK_C may be implemented as a 2-bit signal representing a differential (e.g., true (T) and complementary (C) versions) clock signal for the duplex data buffers 70a-70n. In an example, the signals BCK_T/BCK_C may represent a system clock. In various embodiments, the signal BCOM may be implemented as a 4-bit signal representing data buffer commands. However, other numbers of bits may be implemented accordingly to meet the design criteria of a particular application. The signal BCOM may be implemented as a unidirectional signal from the RCD circuit 74 to the data buffers 70a-70n. In an example, the signal BCOM may be implemented at a single data rate (e.g., 1 bit per signal per clock cycle). However, a particular command may take a different number of clock cycles to transfer information. The signal BCKE may be a function registered dedicated non-encoded signal (e.g., DCKE). The signal BODT may be a function registered dedicated non-encoded signal (e.g., DODT). The signal BVREFCA may be a reference voltage for use with pseudo-differential command and control signals.

The block 190 may be configured to generate the signal SCL. The block 190 may be configured to generate and/or receive the signal SDA. The block 190 may be configured to generate and/or receive the signal GSI_N. The block 190 may be coupled with the controller interface 180. For example, the PMIC interface 190 and/or the controller interface 180 may be configured to facilitate communication between the PMIC 100 and the memory controller 20. The PMIC interface 190 may be enabled in response to the enable command received from the host memory controller 20. In an example, the enable command may be a VR Enable command generated by the host memory controller 20.

The block 192 may be configured to store data. For example the block 192 may comprise a number of registers used for reading from and/or writing to the RCD circuit 74. Generally, the register space 192 is coupled to the various components of the RCD 74 using combinational logic (not shown). The block 192 may comprise a pre-defined register space 194. The pre-defined register space 194 may be configured to store and/or communicate power data received from and/or written to the PMIC 100. The pre-defined registers 194 may store configuration data used to adjust an operating state and/or a status of the RCD 74, the interface 102 and/or the PMIC 100.

The block 196 may be configured as one or more counters. The counters 196 may be configured to track control words received from the host memory controller 20. In some embodiments, the counters 196 may comprise one counter to track read operations and one counter to track write operations. In some embodiments, the counters 196 may comprise one counter configured to track both read operations and write operations. The implementation of the counters 196 may be varied according to the design criteria of a particular implementation.

In various embodiments, the circuit 74 may be enabled to automatically adjust a skew time of a plurality of output pins during a manufacturing test operation. In various embodiments, the circuit 74 may be enabled to adjust the skew time (e.g., tSkew) to within a single gate delay of a reference output clock. As used herein, the term tSkew may be defined as the phase difference between an output data signal or pin (e.g., Q) and an output clock signal or pin (e.g., Y_CLK). In an example, a DDR4 registered clock driver (RCD) may have sixty-six output pins. In another example, a DDR5 standard registered clock driver (RCD) may have a number of pins defined by the DDR5 standard. However, other numbers of output pins may be implemented to meet the design criteria of a particular implementation (e.g., a DDR5 standard implementation).

The circuit 74 may be configured to adjust the phase of the output pins relative to the clock signal Y_CLK (or to respective copies of the clock signal Y_CLK) to meet manufacturer specifications (e.g., within +/−50 µs, etc.). The granularity of the phase adjustment is generally determined by delay elements within the circuit 74. During production testing, the circuit 74 may be configured to perform a trimming process in response to signals from automated test equipment and provide a pass/fail indication to the automated test equipment. In various embodiments, the circuit 74 may be utilized to implement the RCD in DDR4 RDIMM, DDR4 LRDIMM, DDR4 UDIMM and/or DDR5 memory modules.

The signal SCL may be a clock signal generated by the RCD 74. The signal SCL may be a clock signal that operates independently from the system clock signal (e.g., the signals BCK_T/BCK_C, the signal CLK and/or the signal MCLK)). In an example, the clock signal SCL may be an I²C clock output from the RCD 74 to the PMIC 100 communicated over the point-to-point interface 102. The signal SDA may be a data signal generated by the RCD 74 and/or received by the RCD 74. For example, the signal SDA may enable the host memory controller 20 to write to the PMIC 100 through the RCD 74 and/or read from the PMIC 100 through the RCD 74. In an example, the power data signal SDA may be an I²C data input/output between the RCD 74 and the PMIC 100 communicated over the point-to-point interface 102. The RCD 74 may use the interface 102 to send/receive the power data to/from the PMIC 100. The host memory controller 20 may perform a read operation and/or a write operation to the RCD as defined by the DDR5 standard. For example, the host memory controller 20 may read the power data stored in the pre-defined registers 194. In another example, the host memory controller 20 may write instructions for the PMIC 100 into the pre-defined registers 194.

The RCD 74 may use the interface 102 to perform periodic polling and/or interrupt handling. The RCD 74 may use the interface 102 to communicate to the PMIC 100 that the memory module(s) 50a-50n are in a low powered state. The RCD 74 may be configured to drive the interrupt signal GSI_N to a particular state. In one example, the RCD 74 may drive the GSI_N output 170c low, to communicate to the PMIC 100 a notification that the memory modules 50a-50n are in a low power state. The PMIC 100 may detect the notification from the interrupt signal GSI_N and respond accordingly.

Figure 4:
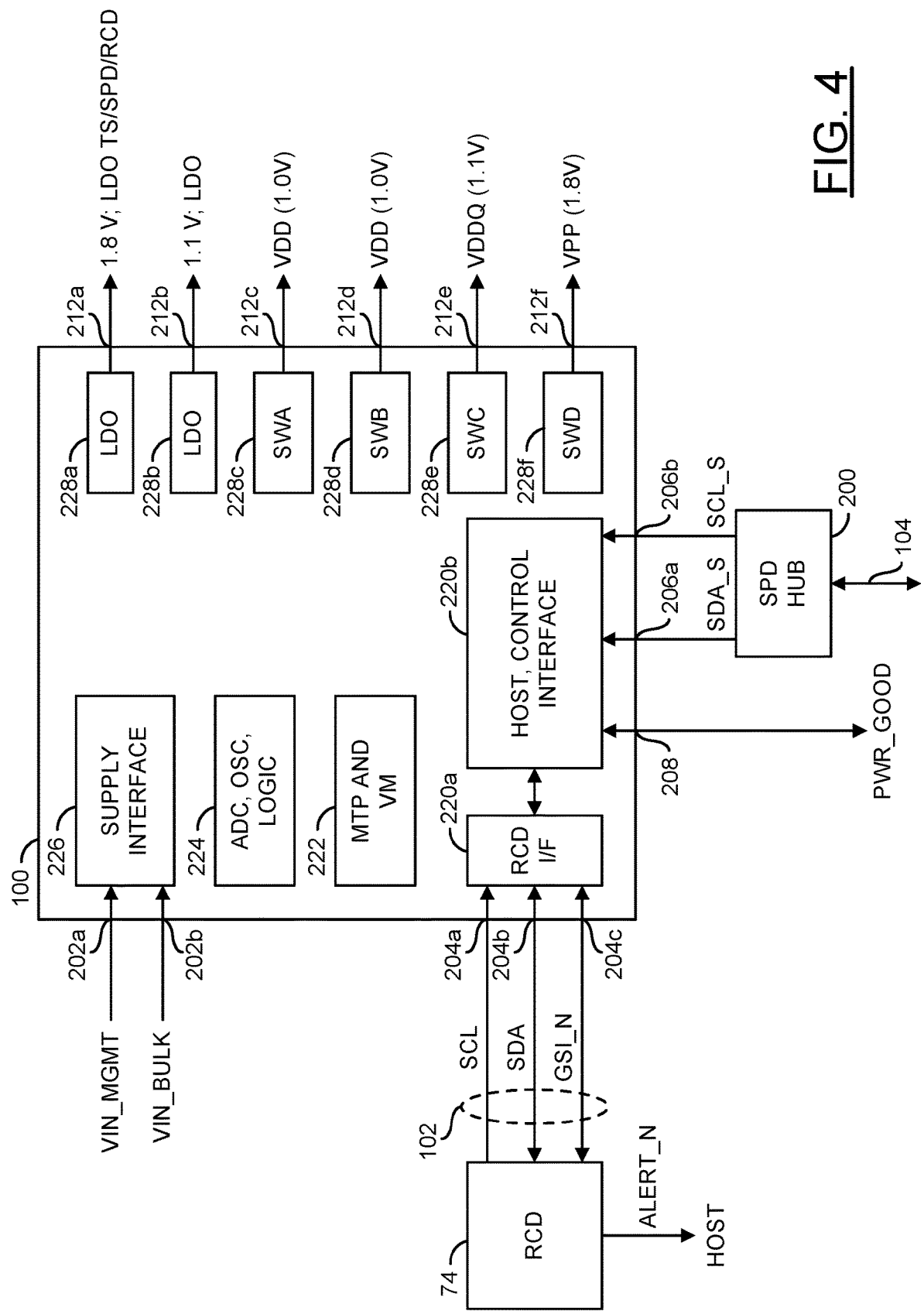
FIG. 4 is a diagram illustrating a block diagram of a power management integrated circuit in accordance with an embodiment of the invention.

Referring to FIG. 4, a diagram illustrating a block diagram of the power management integrated circuit 100 in accordance with an embodiment of the invention is shown. The PMIC 100 is shown connected to the RCD 74 (e.g., via the RCD-PMIC interface 102) and/or a block (or circuit) 200. The circuit 200 may implement a Serial Presence Detect (SPD) hub. The PMIC 100 may be implemented on each of the DIMM memory modules 50a-50n. The PMIC 100 may be implemented according to the DDR5 SDRAM standard. The PMIC 100 may be connected to other components of the memory modules 50a-50n (not shown). The number and/or types of devices connected with the PMIC 100 may be varied according to the design criteria of a particular implementation.

The PMIC 100 may have inputs 202a-202b that receive a voltage supply. For example, the input 202a may receive a signal (e.g., VIN_MGMT) and the input 202b may receive a signal (e.g., VIN_BULK). The PMIC 100 may have inputs/outputs 204a-204c. The inputs/outputs 204a-204c may be I/O ports corresponding to the RCD-PMIC interface 102. For example, the input 204a may receive the signal SCL, the input/output 204b may communicate the signal SDA and the input/output 204c may communicate the signal GSI_N. The PMIC 100 may have inputs 206a-206b that may receive a signal (e.g., SDA_S) and/or a signal (e.g., SCL_S). The signal SDA_S may be a data signal and the signal SCL_S may be a clock signal each received from the SPD hub 200. The PMIC 100 may have an input/output 208 that may communicate a signal (e.g., PWR_GOOD). For example, the signal PWR_GOOD may be a bi-directional signal. The PMIC 100 may have a number of outputs 212a-212f that may present regulated voltages. The PMIC 100 may have other inputs and/or outputs (not shown). The number, type and/or arrangement of the inputs and/or outputs of the PMIC 100 may be varied according to the design criteria of a particular implementation.

The PMIC 100 may comprise blocks (or circuits) 220a-220b, a block (or circuit) 222, a block (or circuit) 224, a block (or circuit) 226 and/or blocks (or circuits) 228a-228f. The blocks 220a-220b may each implement an interface. For example, the interface 220a may be an RCD interface and the interface 220b may be a host interface. The block 222 may implement a Multiple-Time Programmable (MTP) and volatile memory. The block 224 may implement various components such as an analog-to-digital converter (ADC), an oscillator and/or combinational logic. The block 226 may implement a supply interface. The blocks 228a-228f may implement voltage regulation modules. The PMIC 100 may comprise other components and/or connections (not shown). The components of the PMIC 100 may be configured to perform power management for the memory modules 50a-50n. The number, type and/or arrangement of the components of the PMIC may be varied according to the design criteria of a particular implementation.

The SPD hub 200 may implement a serial presence detect protocol. Generally, one SPD hub 200 may be implemented on each of the memory modules 50a-50n. Each of the SPD hubs 200 may enable the memory controller 20 to access information about the memory modules 50a-50n. For example, the SPD hub 200 may provide access to an amount of memory installed, what timings to use, etc. In the example shown, the SPD hub 200 may communicate the signal SDA_S and/or the signal SCL_S with the host interface 220b. However, many different types of data may be communicated by the SPD hub 200. In one example, the SPD hub 200 may communicate using the I²C protocol. In another example, the SPD hub 200 may communicate using the I³C protocol. Implementing the RCD-PMIC interface 102 may reduce an amount of bandwidth on the SPD hub 200.

The SPD hub 200 may communicate with the host memory controller 20. The SPD hub 200 may communicate using the bus 104. The SPD hub 200 may be configured to present the enable command from the host memory controller 20 to the PMIC 100. In an example, the signal SDA_S may communicate the enable command. The RCD interface 220a may be enabled in response to the enable command.

The voltage regulation modules (VRMs) 228a-228f may be configured to provide regulated output voltages for the various components of the memory modules 50a-50n. The PMIC 100 may be configured to manage, maintain and/or adjust the output voltages. The output voltages may be part of the power data communicated using the signal SDA on the RCD-PMIC interface 102. The PMIC 100 may perform adjustments and/or modifications to the output voltages based on instructions received from the RCD 74 and/or the host memory controller 20.

In the example shown, the VRMs 228a-228b may be implemented as low-dropout (LDO) linear voltage regulators. For example, the LDO 228a may present a 1.8V signal (e.g., to one or more of the SPD hub 200, the RCD 74 and/or temperature sensors). In another example, the LDO 228b may present a 1.1V signal. In the example shown, the VRMs 228c-228f may be implemented as switching regulators providing a supply voltage. For example, the switching regulator 228c may provide a 1.0V VDD supply rail. In another example, the switching regulator 228d may provide a 1.0V VDD supply rail. In yet another example, the switching regulator 228e may provide a 1.1V VDDQ supply rail. In still another example, the switching regulator 228f may provide a 1.8V VPP supply rail. The amount of voltage supplied by the VRMs 228a-228f and/or the type of circuitry implemented to perform the voltage regulation may be varied according to the design criteria of a particular implementation.

The supply interface 226 may be configured to receive input power. In the example shown, the supply interface 226 may receive the signal VIN_MGMT and the signal VIN_BULK. The PMIC 100 may be configured to convert the input voltages to the output voltages to provide a stable and/or reliable power supply to the various components of the memory modules 50a-50n.

The block 224 may comprise various components of the PMIC 100. The block 224 may comprise an analog to digital converter, an oscillator and/or logic. In one example, the logic of the block 224 may enable the RCD-PMIC interface 102 in response to the enable command received from the SPD hub 200.

The memory 222 may be configured to store the power management data. The memory 222 may comprise a number of registers. The registers in the memory 222 may be read by the RCD 74 and/or written to by the RCD 74. For example, the registers in the memory 222 may be configured to store power measurement information, current consumption information, status information about the PMIC 100 and/or temperature information. The registers of the memory 222 may be configured to store the power data and/or store write operations forwarded by the RCD 74 from the host memory controller 20. Various bits stored by the registers in the memory 222 may cause the PMIC 100 to adjust a mode of operation and/or various characteristics of the PMIC 100. The type of data stored in the memory 222 may be varied according to the design criteria of a particular implementation.

The RCD interface port 220a may be configured to receive the clock signal SCL from the RCD-PMIC interface 102. The RCD interface 220a may be configured to communicate the power data signal SDA from the RCD-PMIC interface 102 (e.g., bi-directional). The RCD interface 220a may be configured to communicate the interrupt signal GSI_N from the RCD-PMIC interface 102 (e.g., bi-directional). The RCD interface 220a may be configured to enable bi-directional communication of the power data. The RCD interface 220a may be disabled when the PMIC 100 is powered on (e.g., when the modules 50a-50n are powered on when a computer is turned on). The RCD interface 220a may be enabled in response to the enable command received from the host memory controller 20. In an example, the enable command may be a VR Enable command generated by the host memory controller 20. The RCD interface 220a may be configured to enable power management for the memory modules 50a-50n. In some embodiments, the RCD interface 220a may be configured to implement an I²C protocol.

The host and/or control interface 220b may be configured to enable the PMIC 100 to communicate with the host memory controller 20. The host interface 220b may be configured to receive and/or decode the enable command from the signal SDA_S received at the input 206a and/or the signal SCL_S received at the input 206b. The PMIC 100 may activate the RCD interface port 220a (and the RCD-PMIC interface 102) in response to the enable command.

The RCD-PMIC interface 102 may implement an I²C bus. For example, the RCD-PMIC interface 102 may operate at up to 1 MHz. The RCD-PMIC interface 102 may implement the signal SCL and the signal SDA at the I²C bus frequency. The interrupt signal GSI_N may implement an interrupt output and/or command input. By default, the RCD-PMIC interface 102 may be disabled. The host memory controller 20 may enable the PMIC interface 190 (shown in association with FIG. 3) and/or the RCD interface 220a to enable the RCD-PMIC interface 102. For example, the memory controller 20 may enable the RCD interface 220a via the primary host interface 220b.

The PMIC 100 may be configured to drive the interrupt signal GSI_N to a particular state. In one example, the PMIC 100 may drive the GSI_N output low to communicate to the RCD 74 an event interrupt. The RCD 74 may detect the event interrupt from the interrupt signal GSI_N and respond to the event accordingly. In some embodiments, both devices may attempt to communicate the interrupt signal GSI_N at the same time. In an example, the RCD 74 and the PMIC 100 may both attempt to drive the signal GSI_N low. When both the RCD 74 and the PMIC 100 attempt to drive the signal GSI_N low, neither device may take any action and both may wait (e.g., the RCD 74 may be in a low power state). Eventually, the RCD 74 may come out of the low power state and detect the event interrupt generated by the PMIC 100.

The RCD 74 is shown presenting a signal (e.g., ALERT_N). The RCD 74 may generate the signal ALERT_N when the signal GSI_N is detected. The signal ALERT_N may be presented to the host memory controller 20. In an example, the RCD 74 may drive the signal ALERT_N low when the interrupt signal GSI_N is detected as low at the input 170c. The signal ALERT_N may be asserted due to a persistent detection of the signal GSI_N.

The RCD-PMIC interface 102 may enable the memory controller 20 to have access to live power data for each of the memory modules 50a-50n. In response to the power data, the memory controller 20 may adjust an amount of bandwidth and/or adjust access patterns to the DRAM modules 72a-72n. The RCD-PMIC interfaced 102 may enable the RCD 74 to communicate to the PMIC 100 that the RCD 74 is in a low power state. The PMIC 100 may perform power management to improve performance (e.g., reduce power consumption) in response to the RCD 74 being in the low power state. The RCD-PMIC interface 102 may enable ripple voltage optimization in low power modes.

Figure 5:
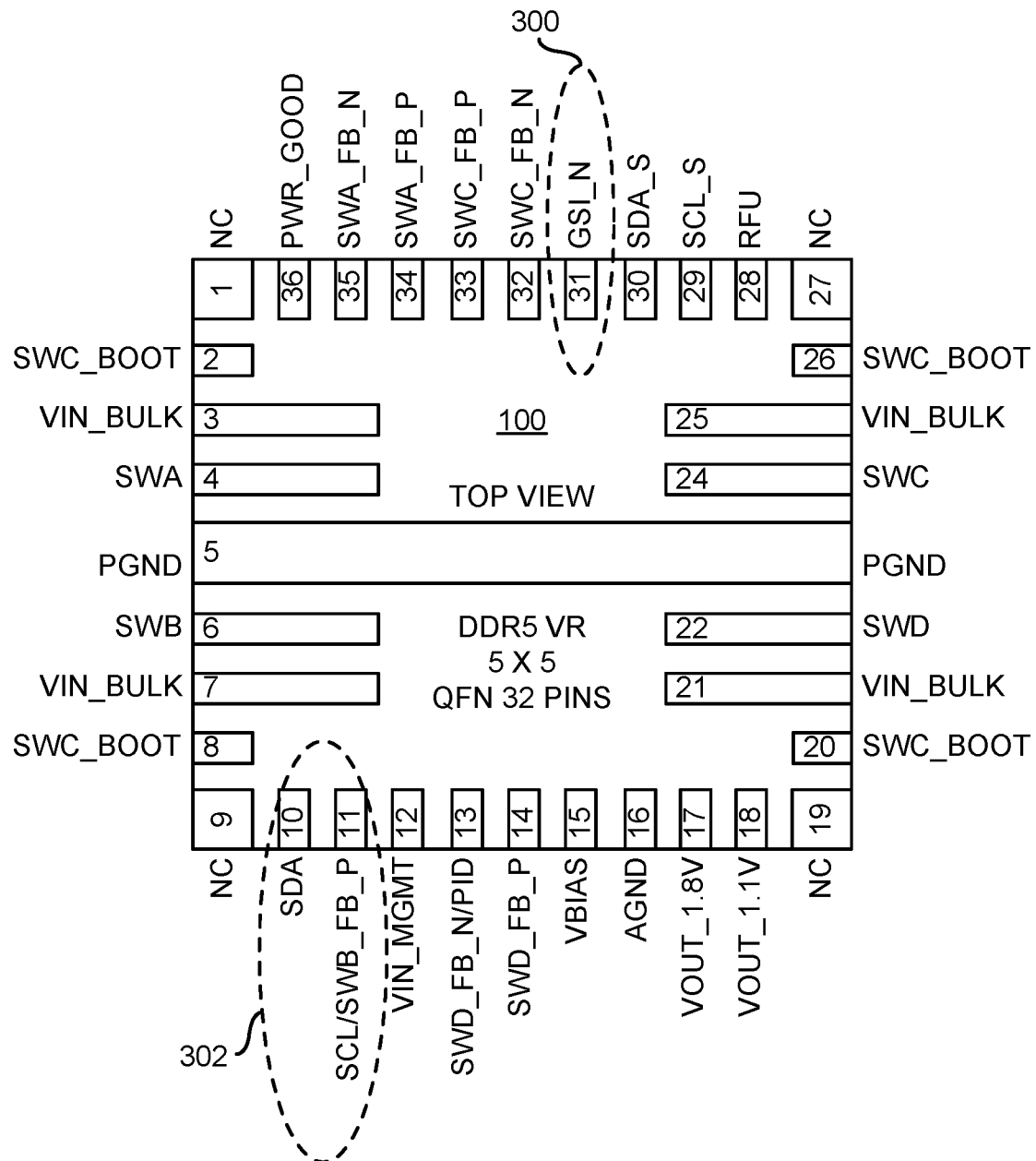
FIG. 5 is a diagram illustrating a pinout diagram of a power management integrated circuit.

Referring to FIG. 5, a diagram illustrating a pinout diagram of the power management integrated circuit 100 is shown. A top view of the microchip package of the PMIC 100 is shown. In an example, the microchip package of the PMIC 100 may be implemented as a quad-flat no-leads (QFN) package. For example, the QFN package of the PMIC 100 may be approximately 5 mm×5 mm in size.

A number of pins are shown for the PMIC 100. In the example shown, the PMIC 100 may be implemented having 36 pins. In an example, pin 3, pin 7, pin 21 and/or pin 25 may be used to communicate the signal VIN_BULK (e.g., the input 202*b* shown in association with FIG. 4) and pin 12 may be used to communicate the signal VIN_MGMT (e.g., the input 202*a* shown in association with FIG. 4). In another example, pin 29 may be used to communicate the signal SCL_S (e.g., the input 206*b* shown in association with FIG. 4), pin 30 may be used to communicate the signal SDA_S (e.g., the input 206*a* shown in association with FIG. 4) and pin 36 may be used to communicate the signal PWR_GOOD (e.g., the input 208 shown in association with FIG. 4). The pinout of the PMIC 100 may be varied according to the design criteria of a particular implementation and/or according to the DDR5 standard JEDEC specification.

The RCD-PMIC interface 102 may be implemented by the PMIC 100 using the DDR5 standard JEDEC pinout with 3 additional pins. An addition 300 is shown. The addition 300 may comprise pin 31. In the example shown, pin 31 may be implemented to send/receive the interrupt signal GSI_N. An addition 302 is shown. The addition 302 may comprise pin 10 and pin 11. In the example shown, pin 10 may be implemented to send/receive the power data signal SDA. In the example shown, pin 11 may be implemented to receive the clock signal SCL. In the example shown, pin 10, 11 and pin 31 may be configured to communicate the signals of the RCD-PMIC interface 102. However, any available and/or unused pins of the PMIC 100 may be utilized to communicate the signals of the RCD-PMIC interface 102.

Similarly, the RCD-PMIC interface 102 may be implemented by the RCD 74 using the DDR5 standard JEDEC pinout with 3 additional pins. In one example, the interrupt signal GSI_N may be implemented at a pin H9 of the RCD 74. In another example, the clock signal SCL may be implemented at a pin H5 of the RCD 74. In yet another example, the power data signal SDA may be implemented at a pin H6 of the RCD 74. However, any available and/or unused pins according to the DDR5 standard for the RCD 74 may be utilized to communicate the signals of the RCD-PMIC interface 102.

Figure 6:
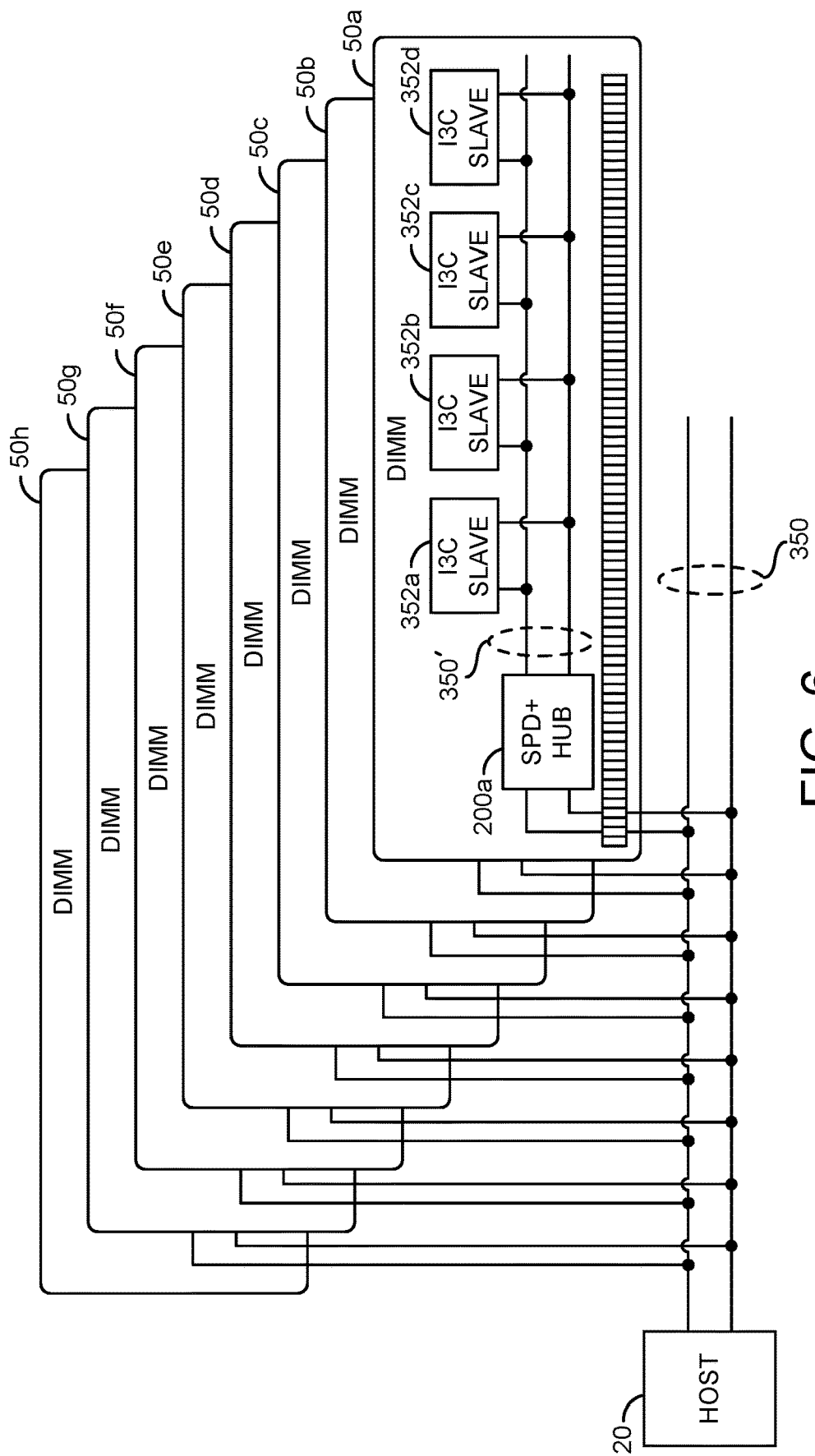
FIG. 6 is a diagram illustrating a I²C/I³C bus between a host memory controller and memory modules.

Referring to FIG. 6, a diagram illustrating a $I^2C/I^3C$ bus between the host memory controller 20 and memory modules 50*a*-50*h* are shown. A system bus 350 is shown. The system bus 350 may implement an $I^2C$ or $I^3C$ protocol. The system bus 350 may correspond with the host interface bus 104 shown in association with FIG. 2. Generally, the system bus 350 may communicate with 8 DIMMs per bus (e.g., the memory modules 50*a*-50*h*).

The memory modules 50*a*-50*h* may each comprise the SPD hub 200 and/or a number of devices 352*a*-352*n*. In the example shown, the SPD hub 200*a* and the slave devices 352*a*-352*d* are shown as a representative example corresponding to the memory module 50*a*. In an example, the slave devices 352*a*-352*d* may be the PMIC 100, the RCD 74 and two temperature sensors. A portion 350' of the system bus 350 is shown on the memory module 50*a* communicating between the SPD hub 200*a* and the slave devices 352*a*-352*d*. In some embodiments, the system bus 350 may communicate with at least five devices per memory module 50*a*-50*h* (e.g., to receive a power measurement readout, a status of the PMIC 100, a temperature readout, a status of the SPD and/or a status of the RCD 74).

Since the system bus 350 may communicate with many devices, there may be bandwidth availability issues on the system bus 350. Implementing the RCD-PMIC interface 102 may reduce bandwidth congestion on the system management bus 350. The RCD-PMIC interface 102 may reduce a latency (e.g., a readout time latency) of communicating the critical power data. The power data may enable the memory controller 20 to adjust memory access patterns. Implementing the RCD-PMIC interface 102 may improve DIMM performance of the memory modules 50*a*-50*h* by improving the output ripple of the PMIC regulator and PMIC power efficiency in low power state utilization.

In an example of the system bus 350 implementing the $I^3C$ protocol (e.g., operating at 12.5 MHz), a total amount of time for a basic periodic readout (e.g., excluding packet error check (PEC), IBI check and/or software overhead) may be approximately 464 μs. For example, using only the system bus 350, the PMIC current/power read out time may be approximately 128 μs (e.g., 8*16) with one PMIC per DIMM and 256 μs (e.g., 2*8*16) with two PMICs per DIMM. In another example, using only the system bus 350, the PMIC general status read out time may be approximately 128 μs (e.g., 8*16) with one PMIC per DIMM and 256 μs (e.g., 2*8*16) with 2 PMICs per DIMM.

In yet another example, using only the system bus 350, the temperature sensor (TS) read out time may be 128 μs (e.g., 8*2*8) with two temperature sensors per DIMM and 48 μs (8*6) with 1 SPD TS per DIMM. In still another example, using only the system bus 350, the SPD readout time may be approximately 80 μs with 1 SPD per DIMM (e.g., likely two registers (MR48 and MR52) would be read in addition to the SPD TS). Additionally, using only the system bus 350 may further include an RCD read out time. In another example, using the $I^2C$ bus protocol (e.g., running at 1 MHZ), the total time for the basic period readout may be approximately 5.5 ms.

The PMIC 100 may be configured to provide live measured power and/or current consumption for each rail (e.g., on each of the voltage regulator modules 228*a*-228*f* and/or the outputs 212*a*-212*f*). For example, the measured power and/or current consumption may be the power data stored in the memory 222. The RCD 74 may be configured to retrieve the power data and store the power data in the pre-defined registers 194. The RCD 74 may provide the power data to the memory controller 20. The memory controller 20 may access the power data and leverage the information to adjust access patterns for the DRAM modules 72*a*-72*n*. Accessing the power data using the system bus 350 (e.g., via the $I^2C/I^3C$ protocol) may be slow and potentially have bandwidth issues, which adds more latency.

Figure 7:
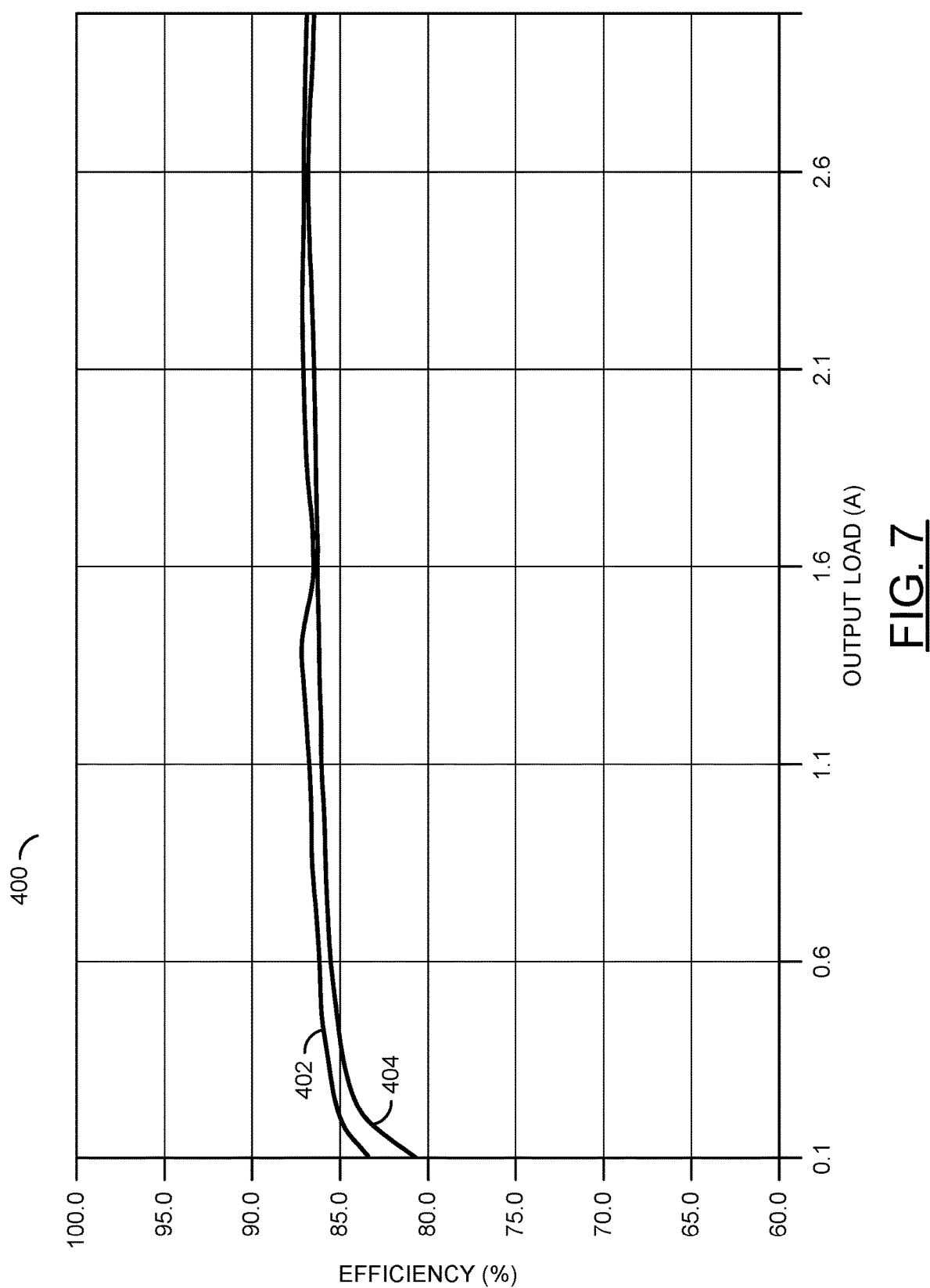
FIG. 7 is a diagram illustrating a graph of power efficiency.

Referring to FIG. 7, a diagram illustrating a graph 400 of power efficiency is shown. A line 402 and a line 404 are shown. The line 402 may represent a power consumption efficiency when the PMIC 100 receives a notification that the entire memory module (e.g., the memory module 50*a*) is in a low power state. The line 404 may represent a power consumption efficiency without using the notification information.

In an example, the memory modules 50*a*-50*n* may be in a self-refresh state and the RCD 74 and/or the data buffers 70*a*-70*n* may be in a clock stopped power down state. When the memory modules 50*a*-50*n* are in a self-refresh state and the RCD 74 and/or the data buffers 70*a*-70*n* are in a clock stopped power down state, the power consumption for each of the memory modules 50*a*-50*n* may be much lower. The RCD 74 may send a signal (e.g., the interrupt signal GSI_N) to the PMIC 100 to adjust the operation of the PMIC 100. The interrupt signal GSI_N from the RCD 74 to the PMIC 100 may provide a notification to the PMIC 100 that the memory module(s) 50*a*-50*n* are in a low power state. For example, the RCD 74 may enter a clock stopped power down state and trigger the notification to the PMIC. The output 170*c* of the RCD 74 may present the interrupt signal GSI_N to the RCD-PMIC interface 102 and the PMIC 100 may receive the signal GSI_N at the input 204c. The RCD 74 may determine that the memory module(s) 50a-50n are in the lower powered state and send the notification without instruction and/or intervention from the host memory controller 20 (e.g., the RCD 74 may take care of determining the state and generating the notification alone).

Implementing the PMIC 100 may offer better efficiency (e.g., approximately 1.5% to 2% when the notification is provided that the memory module(s) 50a-50n are in the low power state. In the example shown, the line 402 (e.g., with the PMIC 100) shows an efficiency of approximately 83% at a 0.1A output load (e.g., a low power state) and the line 404 (e.g., without the PMIC 100) shows an efficiency of approximately 81% at the 0.1A output load (e.g., a difference of approximately 2%). In the example shown, the PMIC 100 may enable adjustments to the memory access patterns and/or frequency scaling in the low power state. However, the PMIC 100 may enable power management to improve efficiency in all power modes. For example, at an output load of 1.1A, the efficiency corresponding to the line 402 may be approximately 87% and the efficiency corresponding to the line 404 may be approximately 86% (e.g., a difference of 1% improvement). In another example, at an output load of 2.1A, the efficiency corresponding to the line 402 may be approximately 86.5% and the efficiency corresponding to the line 404 may be approximately 86% (e.g., a difference of 0.5% improvement). By tweaking the power management performed by the PMIC 100, additional improvements in efficiency may be achieved. The power management performed by the PMIC 100 and/or the efficiency gains achieved by the power management may be varied according to the design criteria of a particular implementation.

Figure 8:
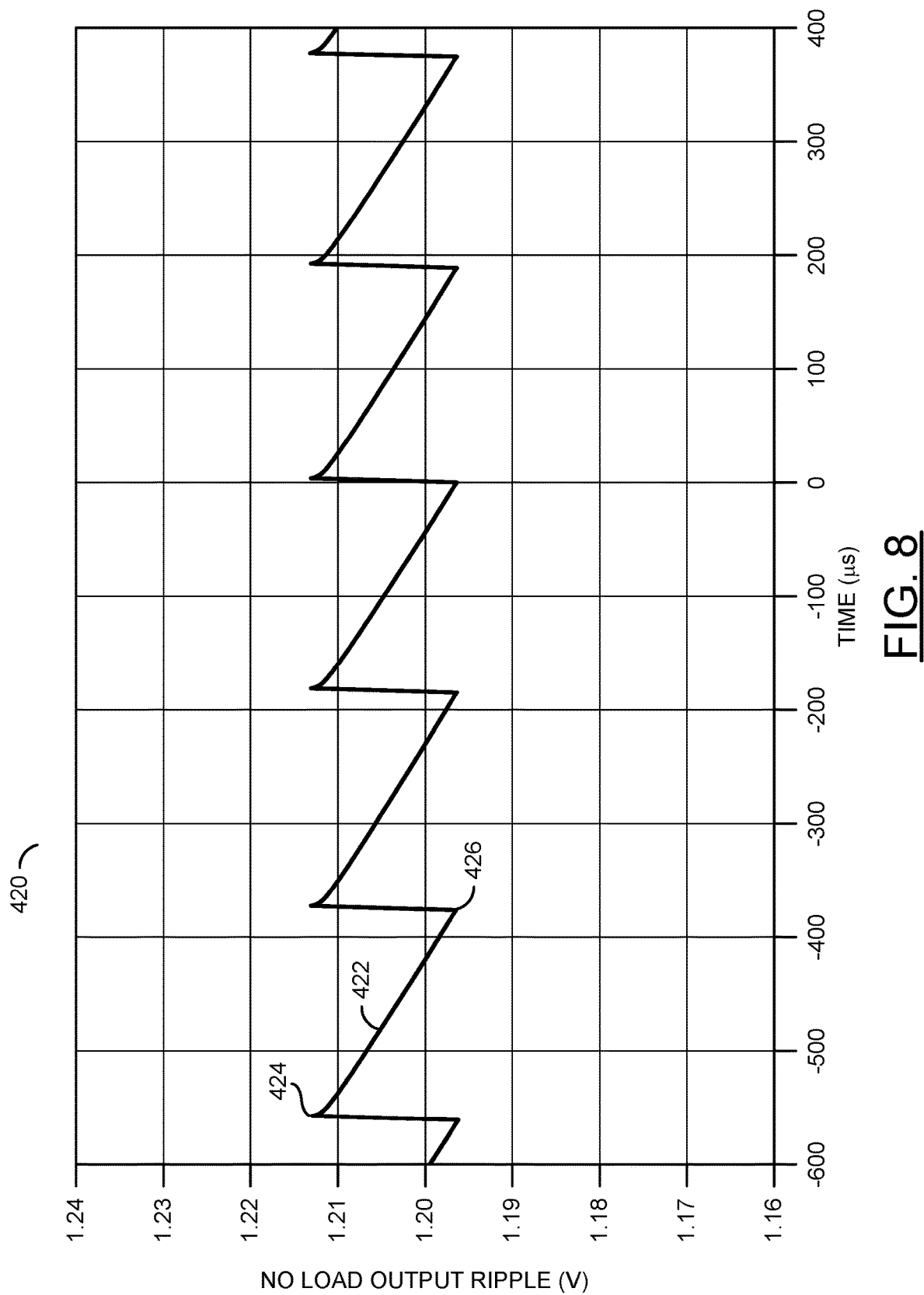
FIG. 8 is a diagram illustrating a graph of a voltage ripple for a no load condition.

Referring to FIG. 8, a diagram illustrating a graph 420 of a voltage ripple is shown. The graph 420 may have an X axis representing time in µs. The graph 420 may have a Y axis representing an output voltage ripple when there is no load. For example, the memory module(s) 50a-50n may be in a low power state when there is no load. A line 422 is shown. The line 422 may represent an output voltage ripple for the PMIC 100 in a no load condition.

In an example, the memory modules 50a-50n may be in a self-refresh state and the RCD 74 and/or the data buffers 70a-70n may be in a clock stopped power down state. When the memory modules 50a-50n are in a self-refresh state and the RCD 74 and/or the data buffers 70a-70n are in a clock stopped power down state, the power consumption for each of the memory modules 50a-50n may be much lower. The interrupt signal GSI_N from the RCD 74 to the PMIC 100 may provide a notification to the PMIC 100 that the memory module(s) 50a-50n are in a low power state. The PMIC 100 may adjust operation in response to the notification provided by the interrupt signal GSI_N.

A peak 424 is shown on the line 422. The peak 424 may be at approximately 1.2125V. A peak 426 is shown in the line 422. The peak 426 may be at approximately 1.1985V. The output voltage line 422 may have a peak-to-peak voltage of approximately (1.2125V-1.1985V) 14 mV. The PMIC 100 may have approximately a 14 mV ripple during a low power state (e.g., no load condition).

Figure 9:
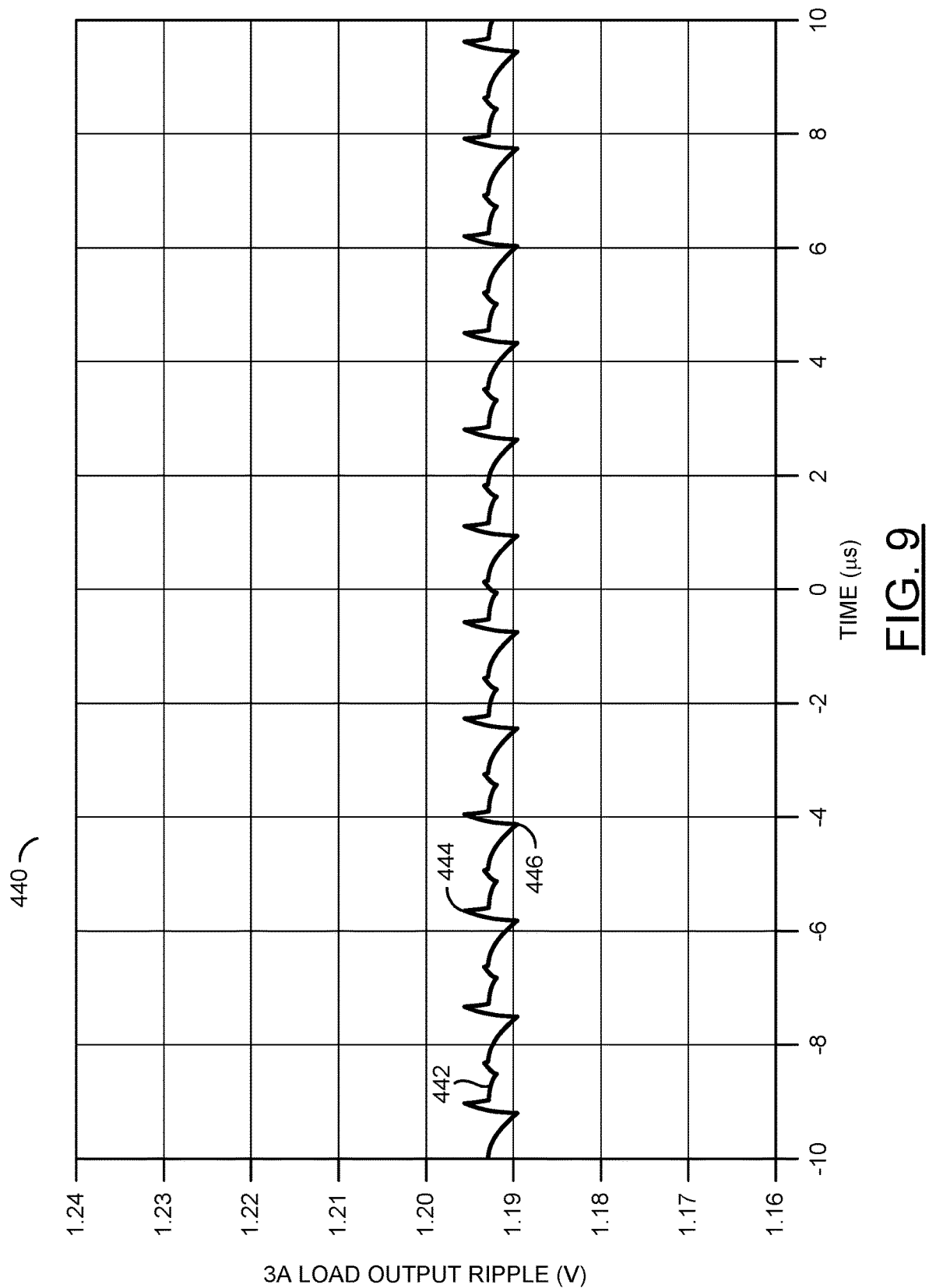
FIG. 9 is a diagram illustrating a graph of a voltage ripple for a load condition.

Referring to FIG. 9, a diagram illustrating a graph 440 of a voltage ripple is shown. The graph 440 may have an X axis representing time in µs. The graph 440 may have a Y axis representing an output voltage ripple when there is a 3A load. For example, the memory module(s) 50a-50n may not be in a low power state when there is a 3A load. A line 442 is shown. The line 442 may represent an output voltage ripple for the PMIC 100 in a 3A load condition.

A peak 444 is shown on the line 442. The peak 444 may be at approximately 1.1955V. A peak 446 is shown in the line 442. The peak 446 may be at approximately 1.1895V. The output voltage line 442 may have a peak-to-peak voltage of approximately (1.1955V-1.1895V) 6 mV. The PMIC 100 may have approximately a 6 mV ripple during the 3A load state.

The RCD 74 may be configured to send the interrupt signal GSI_N to the PMIC 100 to adjust the operation and/or calibrate the PMIC 100. Generally, the PMIC 100 may provide an optimized output ripple when the entire memory module(s) 50a-50n is in lower state. In some embodiments, the PMIC 100 may further improve the ripple output performance when not in the low powered state. The adjustments made by the PMIC 100 in response to the interrupt signal GSI_N may conserve power and/or improve performance for the DRAM components 72a-72n. Additionally, components such as the logic components (e.g., the RCD 74, the data buffers 70a-70n, the NVC, etc.) may benefit from the power management performed by the PMIC 100.

The RCD 74 may enable the host memory controller 20 to perform read and write operations to the PMIC register space (e.g., the pre-defined registers 194) through an in-band RCW command. In an example, the pre-defined registers 194 (e.g., the PMIC register space) may range from 0x00 to 0xFF (e.g., a total of 256 8-bit registers). The RCD page 0x81 may be reserved for PMIC write and read operations. The address range 0x60 to 0x67 may be used for the PMIC write operations. The address range 0x70 to 0x77 may be used for PMIC read operations. Other address space in the page 0x81 may be marked as reserved.

The host memory controller 20 may be configured to write to the PMIC 100 through the RCD 74. To perform a write to the PMIC 100, the host memory controller 20 may perform a write operation (e.g., as defined by a normal write operation using the DDR5 standard) to the pre-defined registers 194 of the RCD 74. In an example, the pre-defined registers 194 may be at a location corresponding to RCD page 0x81. Example control words are shown in association with Table 1:

TABLE 1

| RCD Page 0x81 Control Word | Meaning |
|---|---|
| RW60 | PMIC Address A |
| RW61 | Data for Address A |
| RW62 | PMIC Address B |
| RW63 | Data for Address B |
| RW64 | PMIC Address C |
| RW65 | Data for Address C |
| RW66 | PMIC Address D |
| RW67 | Data for Address D |
| RW68 | Reserved |
| ... | ... |
| RW6E | Reserved |
| RW6F | [7:4]: Write Data Status [3:0]: Reserved |

Due to mismatch in bus speed between the host 20 and the RCD 74 (e.g., the system bus 350) and RCD-PMIC interface 102, the host 20 may perform write operations to up to four different addresses at a time to the PMIC 100. The four addresses in the PMIC may be sequential and/or any random order that the host 20 desires. Generally, the RCD page 0x81 is used for write operation to the PMIC 100.

The control word addresses RW60 to RW67 may be used by the host memory controller 20 to perform write operations to the PMIC 100. The host memory controller 20 may provide an op code to write the PMIC address (e.g., an 8-bit address) to even control word addresses (e.g., RW60, RW62, RW64, RW66). For example, the PMIC addresses A, B, C and D may be any random address in the memory 222 of the PMIC 100. The host memory controller 20 may provide an op code to write the PMIC data to odd control word addresses (e.g., RW61, RW63, RW65, RW67). The host memory controller 20 may start the write operation at the control word address RW60 and go up (e.g., RW61, RW62, RW63, etc.) and then loop back to RW60. Some bits (e.g., [7:4]) of the control word address RW6F may contain a write operation status for each address (e.g., to indicate whether the write operation is complete or on-going).

The control words and/or registers 194 used for the PMIC write operations may be varied according to the design criteria of a particular implementation.

The host memory controller 20 may send out the consecutive MRW commands to the RCD 74 (e.g., like any other MRW command). The RCD 74 may implement the counter 196 and increment the counter 196 for each MRW command for PMIC write operation. The RCD 74 may allow up to four PMIC write operation commands at a time. For each MRW command for PMIC write operation, the RCD 74 may generate the write command on the RCD-PMIC interface 102 (e.g., using the I²C protocol) and decrement the counter 196 by one until the counter 196 reaches zero.

When the RCD counter 196 is at zero, the host 20 may start the PMIC write operation to a pre-defined RCD address (e.g., the register address 0x60). In an example, the RCD 74 may always start at the RCD address 0x60 to generate the write command to the PMIC 100 when the counter 196 is incremented to one.

When host 20 makes the write request to the RCD 74, the RCD 74 may execute the operation on the RCD-PMIC interface 102. Due to clock frequency mismatch and/or the RCD 74 being in the middle of another operation, the host 20 may not exactly know when RCD 74 has executed the operation. For each host request, the RCD 74 may provide a status update in the register PG81RW6F [7:4]. The host 20 may read the status and if the write operation is complete, the host 20 may issue another write request to the RCD 74.

The host memory controller 20 may be configured to read from the PMIC 100 through the RCD 74. To perform a read from the PMIC 100, the host memory controller 20 may perform a read operation from the pre-defined registers 194 of the RCD 74 as defined by a normal read operation using the DDR5 standard. In an example, the pre-defined registers 194 may be at a location corresponding to RCD page 0x81. Example control words are shown in association with Table 2:

TABLE 2

| RCD Page 0x81 Control Word | Meaning |
| --- | --- |
| RW70 | PMIC Address A |
| RW71 | Data from Address A |
| RW72 | PMIC Address B |
| RW73 | Data from Address B |
| RW74 | PMIC Address C |
| RW75 | Data from Address C |
| RW76 | PMIC Address D |
| RW77 | Data from Address D |
| RW78 | Reserved |

TABLE 2-continued

| RCD Page 0x81 Control Word | Meaning |
| --- | --- |
| ... | ... |
| RW7E | Reserved |
| RW7F | [7:4]: Read Data Status |
|  | [3:0]: Reserved |

Due to mismatch in bus speed between the host 20 and the RCD 74 (e.g., the system bus 350) and RCD-PMIC interface 102, the host 20 may perform read operations from up to four different addresses at a time from the PMIC 100. The four addresses in the PMIC 100 may be sequential and/or any random order that the host 20 desires. Generally, the RCD page 0x81 is used for read operation from the PMIC 100.

The control word addresses RW70 to RW77 may be used by the host memory controller 20 to perform read operations from the PMIC 100. The host memory controller 20 may generate an op code to write the PMIC address (e.g., an 8-bit address) to even control word addresses (e.g., RW70, RW72, RW74, RW76). For example, the PMIC addresses A, B, C and D may be any random address in the memory 222 of the PMIC 100. The host memory controller 20 may read the PMIC data from odd control word addresses (e.g., RW71, RW73, RW75, RW77). The host memory controller 20 may start the read operation at the control word address RW70 and go up (e.g., RW71, RW72, RW73, etc.) and loop back to RW70. Some bits (e.g., [7:4]) of the control word address RW7F may contain a read operation status for each address (e.g., to indicate whether the read operation is still executing or valid data is present). The control words and/or registers 194 used for the PMIC read operations may be varied according to the design criteria of a particular implementation.

The host 20 may send out consecutive MRW commands to the RCD 74 like any other MRW command. The RCD 74 may implement the counter 196 and increment the counter 196 for each MRW command for PMIC read operations. In some embodiments, the RCD 74 may implement one counter for the PMIC read operations and another counter for the PMIC write operations. In some embodiments, one counter may be implemented by the RCD 74 for both the PMIC read operations and the PMIC write operations. The RCD 74 may allow up to four PMIC read operation commands at a time. For each MRW command for PMIC read operation, the RCD 74 may generate the read command on the RCD-PMIC interface 102 (e.g., using the I²C protocol) and decrement the counter 196 by one until the counter 196 reaches zero.

When the RCD counter 196 is at zero, the host 20 may start the PMIC read operation at a pre-defined address (e.g., the address 0x70). In an example, the RCD 74 may always start at the RCD address 0x70 to generate the read command to the PMIC 100 when the counter 196 is incremented to one.

When host the makes the read request to the RCD 74, the RCD 74 may execute the operation on the RCD-PMIC interface 102. Due to clock frequency mismatch and/or the RCD 74 being in the middle of another operation, the host 20 may not exactly know when the RCD 74 has executed the operation and has valid data in the registers 194. For each host request, the RCD 74 may provide the status update in the register PG81RW7F [7:4]. The host 20 may read the status and if valid data is present, the host 20 may read the data from corresponding registers (e.g., PG81RW71, PG81RW73, PG81RW75, PG81RW77, etc.). The host 20 may read the power data by performing the normal control word read procedure defined by the DDR5 standard.

The RCD 74 may access the PMIC register space (e.g., the memory 222). The RCD 74 may be configured to periodically poll the PMIC 100 for the general status of the PMIC 100. In an example, the polling frequency may be controlled by the register PG82RW7E [7:5]. The RCD 74 may generate a read command to the PMIC 100 to a predefined range in the memory register space 222 (e.g., addresses 0x08 to 0x0F and 0x33). The RCD page 0x82 may be reserved for the read command that is generated internally by the RCD 74 (e.g., without prompting from the memory module 20) and sent to the PMIC 100 due to either periodic polling and/or a GSI_N interrupt handling process.

The RCD 74 may be configured to periodically poll the PMIC 100 and/or handle event interrupts received from the PMIC 100. Data acquired from the PMIC 100 by the RCD 74 may be stored in the pre-defined registers 194. The host memory controller 20 may access the data retrieved by the RCD 74 as defined by the DDR5 standard. In one example, the pre-defined registers 194 used by the RCD 74 to store data read by the RCD 74 from the PMIC 100 may be at a location corresponding to RCD page 0x82. The host memory controller 20 may not be allowed to write to the RCD page 0x82 but may read from the registers to read the status of the PMIC 100 using the normal read procedure as defined by the DDR5 standard. Example control words are shown in association with Table 3, Table 4 and Table 5:

TABLE 3

| RCD Page 0x82 Control Word | PMIC Address Space | Meaning |
|---|---|---|
| RW60 | See Table 4 | Data Read by RCD from Periodic Polling |
| RW61-RW63 | Reserved | |
| RW64 | 0x08 | |
| RW65 | 0x09 | |
| RW66 | 0x0A | |
| RW67 | 0x0B | |
| RW68 | 0x0C | |
| RW69 | 0x0D | |
| RW6A | 0x0E | |
| RW6B | 0x0F | |
| RW6C | 0x31 | |
| RW6D | 0x33 | |
| RW6E-RW6F | Reserved | |
| RW70 | See Table 4 | Data Read by RCD due to GSI_N Interrupt Handling |
| RW71-RW73 | Reserved | |
| RW74 | 0x08 | |
| RW75 | 0x09 | |
| RW76 | 0x0A | |
| RW77 | 0x0B | |
| RW78-RW7C | Reserved | |
| RW7D | 0x33 | |
| RW7E | RCD Config Registers | |
| RW7F | RCD Config Registers | |

TABLE 4

| Page 0x82 | Bits | Description |
|---|---|---|
| RW60 | 7 | PMIC Polling Status |
| | 6:0 | Reserved |
| RW70 | 7 | GSI_N Interrupt Handling Status |
| | 6:0 | Reserved |

The host memory controller 20 may configure the RCD configuration registers in the RCD 74 at power up. By default, the RCD-PMIC interface 102 may be disabled.

TABLE 5

| CW | Bits | Description |
|---|---|---|
| RW7E | 7:5 | Polling Frequency |
| | 4:0 | Reserved |
| RW7F | 7 | GSI_N Enable |
| | 6 | I²C Interface Enable |
| | 5:4 | I²C Interface Clock Frequency |
| | 3 | Reserved |
| | 2 | Low Power Optimization Enable |
| | 1 | Generate Mask Command when GSI_N is asserted |
| | 0 | Generate Clear Command when GSI_N is asserted |

The RCD 74 may be configured to respond to the interrupt signal GSI_N received from the RCD-PMIC interface 102. For example, the PMIC 100 may drive the signal GSI_N low to indicate that an event interrupt has occurred. The RCD 74 may not be able to respond to some events detected by the PMIC 100. In an example, the RCD 74 may not be able to respond because the RCD 74 cannot operate due to power loss (e.g., the event detected by the PMIC 100 may be the loss of power). A summary of event handling by the RCD 74 in response to the interrupt signal GSI_N presented by the PMIC 100 is shown in Table 6 and Table 7. Table 7 also shows the status of the signal PWR_GOOD from the PMIC 100 for each event as a reference. In some embodiments, the RCD 74 may not be expected to do anything related to the signal PWR_GOOD. In Table 6 and in Table 7, PG may indicate 'Power Good', OV may indicate 'Over Voltage', UV may indicate 'Under Voltage' and CL may indicate 'Current Limit'.

TABLE 6

| Event | Status Bits | Clear Bits | Mask Bits |
|---|---|---|---|
| VIN_BULK PG | R08 [7] | R10 [7] | R15 [7] |
| VIN_MGMT PG | R08 [6] | R10 [6] | R15 [6] |
| VIN_BULK OV | R08 [0] | R10 [0] | R15 [0] |
| VIN_MGMT OV | R08 [1] | R10 [1] | R15 [1] |
| SWA-SWD PG | R08 [5:2] | R10 [5:2] | R15 [5:2] |
| 1.8 LDO PG | R09 [5] | R11 [5] | R16 [5] |
| 1.1 LDO PG | R33 [2] | R14 [2] | R19 [2] |
| VBIAS LDO PG | R09 [6] | R11 [6] | R16 [6] |
| SWA-SWD OV | R0A [7:4] | R12 [7:4] | R17 [7:4] |
| SWA_SWD UV | R0B [3:0] | R13 [3:0] | R18 [3:0] |
| VBIAS UV | R33 [3] | R14 [3] | R19 [3] |
| SWA-SWD CL | R0B [7:4] | R13 [7:4] | R18 [7:4] |
| SWA-SWD High Current/Power | R09 [3:0] | R11 [3:0] | R16 [3:0] |
| High Temp Warn | R09 [7] | R11 [7] | R16 [7] |
| Critical Temp | N/A | N/A | N/A |
| VIN_MGMT to VIN_BULK Switchover | R09 [4] | R11 [4] | R16 [4] |
| Valid VIN_MGMT in Switchover | R33 [4] | R14 [4] | R19 [4] |

TABLE 7

| Event | VReg Disable | PWR_GOOD | GSI_N | RCD Response |
|---|---|---|---|---|
| VIN_BULK PG | No | Low | Low | 2 |
| VIN_MGMT PG | No | High | Low | 2 |
| VIN_BULK OV | Yes | Low | Low | 1 |
| VIN_MGMT OV | No | High | Low | 2 |
| SWA-SWD PG | No | Low | Low | 2 |
| 1.8 LDO PG | No | Low | Low | 2 |
| 1.1 LDO PG | No | Low | Low | 2 |
| VBIAS LDO PG | No | Low | Low | 2 |
| SWA-SWD OV | Yes | Low | Low | 1 |
| SWA_SWD UV | Yes | Low | Low | 1 |

TABLE 7-continued

| Event | VReg Disable | PWR_GOOD | GSI_N | RCD Response |
|---|---|---|---|---|
| VBIAS UV | Yes | Low | Low | 1 |
| SWA-SWD CL | No | High | Low | 2 |
| SWA-SWD High Current/Power | No | High | Low | 2 |
| High Temp Warn | No | High | Low | 2 |
| Critical Temp | Yes | Low | Low | 1 |
| VIN_MGMT to VIN_MGMT Switch | No | High | Low | 3 |
| VIN_MGMT to VIN_MGMT Switch | No | High | Low | 3 |

Generally, the RCD 74 may perform three different categories of responses when the interrupt signal GSI_N is presented by the PMIC 100 (e.g., GSI_N is detected as low at the input 170c of the RCD 74). A first category (e.g., RCD Response 1 in Table 7) may represent a situation when power may be lost. For example, the RCD 74 may not be able to perform a response because eventually power will be lost. A second category (e.g., RCD Response 2 in Table 7) may comprise clearing the corresponding PMIC register shown in Table 6. If the interrupt signal GSI_N persists, the RCD 74 may mask the PMIC register shown in Table 6. The host memory controller 20 may decide what to do next. A third category (e.g., RCD Response 3 in Table 7) may comprise clearing the corresponding PMIC register shown in Table 6. In each response category, the RCD 74 may assert the signal ALERT_N (e.g., drive ALERT_N low). Clearing the PMIC register may clear the error command to the RCD. The RCD may de-assert the signal ALERT_N (RW04 code: 0xFE).

One of the pre-defined registers 194 may be an error log register. Generally, when implementing the RCD-PMIC interface 102, the RCD 74 may utilize the same registers as defined by the DDR5 standard. A control word (e.g., address RW24[0]) may be used to identify a PMIC error. When there is a clear PMIC error command, the RCD 74 may reset the bit in the control word address RW24[0] and stop driving the signal ALERT_N (assuming the interrupt signal GSI_N is not asserted).

In some embodiments, read operations from the PMIC 100 may be the most frequent operation type. For example, the PMIC 100 may use the most amount of data reads. Since the PMIC 100 data reads may be the most frequent operation type, the RCD-PMIC interface 102 may be used to perform the data reads and alleviate bandwidth limitations on the system management bus 350.

Implementing the RCD-PMIC interface 102 may enable the host memory controller 20 to use the I$^2$C protocol for the system bus 350 (e.g., instead of the I$^3$C protocol). The RCD-PMIC interface 102 may offer autonomous operation to improve the power efficiency and/or electrical characteristics of the memory modules 50a-50n. For example, the PMIC 100 may improve power efficiency by adjusting voltage levels and/or performing frequency scaling. In an example, the power management may be customized in either the RCD 74 and/or the PMIC 100.

In some embodiments, the input/output levels for the interrupt signal GSI_N and/or the power data signal SDA communicated from the RCD 74 to the PMIC 100 may be based on a 1.1V supply and use Open Drain 1.1V I/O levels. Since the interrupt signal GSI_N is a bi-directional signal, a pullup resistor to 1.1V supply on the DIMM board may be implemented. The 1.1V supply for the pullup resistor may be the same 1.1V supply that the RCD 74 may receive on VDD pins and/or be a different 1.1V supply that the PMIC 100 may generate from the 1.1V LDO output 212b. The I/O level for the clock signal SCL from the RCD 74 to the PMIC 100 may be based on the 1.1V supply and may be a 1.1V push pull level. In an example, the pullup resistor for the interrupt signal GSI_N may be approximately 1K Ohm. The value of the pullup resistors for the signal GSI_N and/or the signal SDA may be varied according to the design criteria of a particular implementation.

The RCD 74 may be the master component for the I$^2$C interface 102 for the PMIC 100. For example, the RCD 74 may implement a master I$^2$C protocol. The RCD 74 may communicate using the standard I$^2$C protocol to the PMIC 100 regardless of what the host memory controller 20 uses to communicate to the RCD 74 (e.g., as a slave). For example, the protocol used to communicate between the RCD 74 and/or the host memory controller 20 may be either I$^2$C or I$^3$C.

The RCD 74 may generate the clock signal SCL internally. The frequency of the clock signal SCL may be configured through the registers 194 (e.g., the register PG82RW7F [5:4]). In an example, the RCD 74 may not be required to generate a precise output clock frequency. The output clock frequency of the signal SCL may vary within a 50% range of the configured register value. The RCD 74 may source the clock signal SCL independently from a clock input (e.g., from the host 20) to enable the RCD 74 to generate commands independently and/or to execute commands received from the host 20 regardless of the state of the clock input from the host 20. In an example, at first initial power on, the RCD 74 does not generate the clock signal SCL. The host 20 may enable the RCD-PMIC interface 102 by setting one of the registers 194 to a particular value (e.g., PG82RW7F [6]='1'). In a clock stopped power down mode, the RCD 74 may shut off the SCL output 170a and/or the SDA I/O 170b.

The PMIC 100 may assert the interrupt signal GSI_N at any time during normal operation to communicate any event. The RCD 74 may respond to the PMIC 100 and the host 20 to all assertions of the interrupt signal GSI_N detected except for a clock stopped power down mode.

Then the RCD 74 receives the interrupt signal GSI_N, the RCD 74 may execute at least two steps. One step may be that the RCD 74 may assert the signal ALERT_N to the host 20. Another step may be that the RCD 74 generates a read command to the PMIC 100 to pre-defined PMIC registers (e.g., registers 0x08 to 0x0B and 0x33). Based on the data that RCD 74 reads from the PMIC registers 222, the RCD 74 may decipher the event that caused the interrupt signal GSI_N to be asserted (e.g., by looking at which status bit register is set). In some embodiments, the RCD 74 may determine that more than one status bit registers are set. Based on which status bit register is set, the RCD 74 may decides which response to take (e.g., Response 1, Response 2 and/or Response 3 as shown in association with Table 7). If more than one status bit register is set, the RCD 74 may execute more than one response.

For the 11 events that comprise Response 1, the PMIC 100 may automatically and independently trigger a VR Disable command (e.g., disable voltage regulation). The VR Disable command may cause the RCD 74 to lose power and no action is needed (or possible) by the RCD 74. In some embodiments, the RCD 74 may attempt to read the PMIC status registers 222 as described above to decipher what event caused the assertion of the interrupt signal GSI_N, but eventually the RCD 74 will lose power. If the RCD 74 was able to complete the read operation and decipher what caused the GSI_N signal assertion before power is lost, the RCD 74 may not take any further action based on these events. The system host 20 may be expected to take specific action to either power cycle the PMIC 100 (e.g., if the PMIC 100 was in Secure Mode) or read the status register 222 and try to issue a VR Enable (e.g., enable voltage regulation) command again (e.g., if the PMIC 100 was in Programmable Diagnostic Mode) to see if the PMIC 100 recovers. Otherwise, the host 20 may power cycle the PMIC 100 again.

For the 19 events that comprise Response 2, the read response from the PMIC 100 may be updated in the RCD registers 194 (as shown in association with Table 3). In an example, the RCD 74 may update the status in register PG82RW70 [7]. If PG82RW7F [0]='1', then the RCD 74 may generate a Write '1' command to the corresponding Clear Bit Register location as shown in Table 3 to clear the status register of the PMIC 100 (e.g., indicating that the RCD 74 has deciphered which event caused the interrupt signal GSI_N). The RCD 74 may generate a Write '1' command to the all 8 bits of the corresponding Clear register to clear the entire 8 bits of the status register.

The Write '1' command may cause the PMIC 100 to stop asserting the interrupt signal GSI_N if the event is no longer present. The RCD 74 may wait (e.g., a maximum of 5 µs) to let the PMIC 100 let go of the assertion of the interrupt signal GSI_N after generating the clear command. For example, the 5 µs wait time may be referenced from the rising edge of the clock when the RCD 74 receives an acknowledge indication from the PMIC 100. If the event is still present, the PMIC 100 may continue to assert the interrupt signal GSI_N and the status bit will not be cleared.

If the event is still present at the RCD 74 (e.g., after the 5 µs wait), the RCD 74 will see the signal GSI_N asserted (e.g., at the input 170*c*). If the register PG82RW7F [1]='1', the RCD 74 may generate a Write '1' command to the corresponding Mask Bit Register location (shown in association with Table 3) to mask the interrupt signal GSI_N. In some embodiments, since the RCD 74 has already deciphered which event caused the signal GSI_N, additional work may not be necessary. In some embodiments, the RCD 74 may read the event status to determine if the event is the same. If the event is the same, the Write '1' command to the appropriate mask register should cause the PMIC 100 to stop asserting the signal GSI_N signal. The RCD 74 may wait (e.g., a maximum of 5 µs) to let the PMIC 100 stop assertion of the signal GSI_N after generating the mask command. For example, the 5 µs time is referenced from the rising edge of the clock when the RCD 74 receives an acknowledge indication from the PMIC 100. When the RCD 74 generates the Write '1' command to mask the appropriate registers, the RCD 74 may not alter a mask setting that the host 20 may have programmed at initial power on.

In some embodiments, after masking, the PMIC 100 may still assert the interrupt signal GSI_N to the RCD 74. The RCD 74 may assume that there may be another new event causing the assertion of the interrupt signal GSI_N. The RCD 74 may repeat reading the PMIC registers (e.g., 0x08 to 0x0B and 0x33) and decide which response to take until the GSI_N signal is no longer seen asserted at the input 170*c*. In some embodiments, when the RCD 74 repeats the PMIC register read operation, only the last read information may be stored in the RCD registers 194 (e.g., if the PMIC status registers 194 are updated from a first read operation to a second read operation, the host 20 may know the data from the second read operation). The host 20 may miss the data from the first read operation (e.g., the host 20 may miss some (e.g., the first) event information).

The RCD 74 may wait until there are any new assertions of the signal GSI_N. For any masked command that the RCD 74 has already issued, there may not be further independent action taken by the RCD 74. For example, the RCD 74 may wait for further instruction from the host memory controller 20.

For the 2 events that comprise Response 3, the read response from the PMIC 100 may be updated in the RCD registers 194 (e.g., as shown in association with 3). For example, the RCD 74 may update the status in the register PG82RW70 [7]. If PG82RW7F [0]='1', the RCD 74 may generate a Write '1' command to the corresponding Clear Bit Register location (as shown in Table 3) to clear the PMIC status register (e.g., indicating that the RCD 74 has deciphered which event caused the interrupt signal GSI_N). The RCD 74 may generate the Write '1' command to the all 8 bits of the corresponding Clear register to clear the entire 8 bits of the status register.

The Write '1' command may cause the PMIC 100 to stop asserting the interrupt signal GSI_N if there are no other events. The RCD 74 may wait (e.g., a maximum of 5 µs) to let the PMIC 100 stop assertion of the signal GSI_N after generating the clear command. For example, the 5 µs time may be referenced from a rising edge of the clock when the RCD 74 receives the acknowledge notification from the PMIC 100. At this point the RCD 74 may wait for any new assertions of the signal GSI_N.

The RCD 74 may assert the signal ALERT_N if PG82RW7F [7]='1' and the interrupt signal GSI_N is asserted. An amount of time for asserting the signal ALERT_N may be based on whether the signal GSI_N is asserted for 20 ns or less. The host memory controller 20 may read the error log register (e.g., RW20 to RW24) to determine the cause of the signal ALERT_N. If the signal ALERT_N is triggered due to the PMIC 100, the host 20 can further read the status from page 0x82 (e.g., registers 0x68 to 0x6B and 0x71). The signal ALERT_N may be persistent until the host 20 sends the 'Clear PMIC Error' command.

When RCD 74 receives the 'Clear PMIC Error' command from the host 20, the RCD 74 may clear the GSI_N status in RW24 OP [0] and stop driving the signal ALERT_N (e.g., if the interrupt signal GSI_N is not asserted). If the interrupt signal GSI_N is still asserted when the RCD 74 receives the 'Clear PMIC Error' command, the RCD 74 will continue to assert the signal ALERT_N and the RW24 OP [0] status bit may remain at '1' If the memory modules 50*a*-50*n* are in a clock stopped power down mode, the RCD 74 may shut off the inputs and/or outputs 170*a*-170*c* (e.g., for the signals SDA, SCL and GSI_N). For example, the RCD 74 may not take any action during the clock stopped power down mode. However, there may be some corner case conditions that occur as event interrupts as well as clock stopped power down mode events that may be truly random and/or asynchronous.

One corner condition may be that the RCD 74 detects the interrupt signal GSI_N and immediately after enters in the clock stopped power down mode. In response, the RCD 74 may assert the signal ALERT_N and maintain the assertion to the host 20. Since the interrupt handling process has not been started by the RCD 74, the RCD 74 may enter in the clock stopped power down mode and abort the interrupt handling process. The RCD 74 may shut down the output 170*a* (e.g., for SCL) and the I/O 170*b* (e.g., for SDA). When the RCD 74 exits the clock stopped power down mode, the interrupt handling process may be resumed.

One corner condition may be that the RCD 74 detects the interrupt signal GSI_N, starts an interrupt handling process and during the process enters the clock stopped power down mode. In response, the RCD 74 may have already asserted the signal ALERT_N and may maintain the assertion to the host 20. Since the RCD 74 may have already started the interrupt handling process, the RCD 74 may continue the interrupt handling process even though the RCD 74 may have entered in the clock stopped power down mode. Once the RCD 74 completes the interrupt handling process, the output 170a (e.g., for the signal SCL) and the I/O 170b (e.g., for the signal SDA) may be shut down. When the RCD 74 exits the clock stopped power down mode, the host 20 may be expected to resume normal operation.

One corner condition may be that the RCD 74 may be in the middle of a periodic polling operation and enters in the clock stopped power down mode. In response, the RCD 74 may complete the polling operation. Once the RCD 74 completes the polling operation, the output 170a (e.g., for the signal SCL) and the I/O 170b (e.g., for the signal SDA) may be shut down.

One corner condition may be that the RCD 74 may be in the middle of executing a PMIC Write/Read operation per a request from the host 20 through the SMBus interface 350 and enters the clock stopped power down mode. In response, the RCD 74 may complete the PMIC write/read operation. Once the read/write operation is complete, the output 170a (e.g., for the signal SCL) and the I/O 170b (e.g., for the signal SDA) may be shut down. Generally, it may be unlikely that the host 20 would make a request through SMBus 350 for the PMIC 100 while at the same time putting the RCD 74 in the clock stopped power down mode.

The RCD 74 may implement an arbitration scheme for when more than one request or event occurs simultaneously. For example, if the RCD 74 is in the middle of executing any given operation when another request is received and/or another event happens, the RCD 74 may be configured to complete the operation before serving the new request/event. The RCD 74 may arbitrate if there are more than one new requests/events. Generally, the RCD 74 may not abort the ongoing operation to serve another request.

The priority order when the RCD 74 receives a request from the host 20 for a PMIC read/write operation at the same time when the periodic polling timer expires and/or when the GSI_N interrupt event occurs is shown in Table 8. The priority order when the RCD 74 receives the interrupt signal GSI_N at the same time as the periodic polling timer expires in absence of request from the host 20 is shown in Table 9.

TABLE 8

| Priority | Normal Event No GSI Interrupt | Host Request & GSI Interrupt | Host Request & Periodic Polling with no GSI Interrupt |
|---|---|---|---|
| 1 | Host PMIC Read Request | Host PMIC Read Request | Host PMIC Read Request |
| 2 | Host PMIC Write Request | Host PMIC Write Request | Host PMIC Write Request |
| 3 | Periodic Polling | GSI_N Interrupt Handling | Periodic Polling |
| 4 | | Periodic Polling | |

TABLE 9

| Priority | Normal Event No GSI Interrupt | GSI Interrupt | Periodic Polling & No GSI Interrupt |
|---|---|---|---|
| 1 | Periodic Polling | GSI_N Interrupt Handling | Periodic Polling |
| 2 | | Periodic Polling | |

In some embodiments, per registers PG82RW7F [7:6], the RCD-PMIC interface 102 may be disabled. At first power on, the host 20 may enable the interface 102 by setting the bits to '1'. The host 20 may enable either one or both registers. For example, if PG82RW7F [6]='1', the host 20 may also enable a low power optimization feature by setting PG82RW7F [2]='1'. In another example, if PG82RW7F [7]='1', the host 20 may also set PG82RW7F [0]='1' to generate a Write '1' command to clear the status of the interrupt signal GSI_N.

The RCD 74 may offer a clock stopped power down mode to reduce the power consumption of the memory modules 50a-50n when not in use. The power consumption during the clock stopped power down mode may be relatively small compared to the normal mode of operation of the memory modules 50a-50n. The exit latency from clock stopped power down mode to the first DRAM operation may be relatively large compared to normal mode.

If PG82RW7F [2]='1', when the RCD 74 detects the clock stopped power down mode, the interrupt signal GSI_N may be pulled low (e.g., asserted to the PMIC 100 at the input 204c). Providing the interrupt signal GSI_N to the PMIC 100 may communicate to the PMIC 100 that the memory module(s) 50a-50n are in the low power mode. In an example, the PMIC 100 may check the GSI_N input 204c when the PMIC 100 is not driving the signal GSI_N low (e.g., to indicate an interrupt event). When PMIC 100 detects the signal GSI_N, the PMIC 100 may adjust an operation mode to the low power mode.

When the system host memory controller 20 takes the RCD 74 out of the clock stopped power down mode (e.g., by providing a valid input clock), the RCD 74 may stop driving the interrupt signal GSI_N input low. In an example, the PMIC 100 may check the GSI_N input 204c when the PMIC 100 is not driving the signal GSI_N low. When the PMIC 100 detects that the signal GSI_N is not low, the PMIC 100 may revert back to a normal (e.g., original) mode.

When the RCD 74 is not driving the signal GSI_N low and detects the interrupt signal GSI_N low at the input 170c, the RCD 74 may treat the assertion as an interrupt event from the PMIC 100. When the PMIC 100 is not driving the interrupt signal GSI_N low and detects the signal GSI_N low at the input 204c, the PMIC 100 may treat the assertion as a low power mode entry. For example, in the low power mode, the PMIC 100 may adjust the behavior characteristics of the voltage regulation modules 228a-228f.

In a rare occasion when both devices pull the signal GSI_N low at the same time, the RCD 74 may not take any action because the RCD 74 may already be in the clock stopped power down mode. When the RCD 74 exits the clock stopped power down mode, the signal GSI_N may be detected at the input 170c and the RCD 74 may handle the interrupt event. When both the RCD 74 and the PMIC 100 assert the signal GSI_N, the PMIC 100 may not enter in low power mode and may continue to operate as if a normal interrupt has been asserted by the PMIC 100. When the RCD 74 and the PMIC 100 stops driving the interrupt signal GSI_N, both may wait (e.g., a minimum 10 ns) before the GSI_N input to see if the other device has asserted the signal GSI_N or not.

In some embodiments, at initial power on, the RCD 74 may optionally perform the read operation to determine the exact voltage from the regulators 228c-228f and determine what the RCD 74 is receiving on the VDD input supply. The RCD 74 may optionally adjust and/or optimize the internal circuitry without any help or knowledge by the host 20 for that given DIMM design based on the voltage reading. Generally, the voltage readout may not drift over temperature from Vmin to Vmax. The RCD 74 may use the lack of drifting for tuning. To read the exact voltage from the PMIC 100 output, the RCD 74 may generate a read command to the PMIC 100 to address R30 to see whether the host 20 has enabled the ADC. The RCD 74 may store the result in a temporary memory. If the host 20 has not enabled the ADC, a write command to R30 may enable ADC and select the appropriate voltage rail. If the host 20 has enabled the ADC, then a write command to R30 may be generated to select the appropriate voltage. A read command may be generated to the PMIC 100 (e.g., address 0x31) to read out the code. Similar steps may be repeated to read all appropriate voltages. A write command may be generated to the PMIC 100 (e.g., address R30) to restore original settings.

The RCD 74 (e.g., as a master) may only communicate standard I$^2$C protocol to the PMIC 100 (e.g., as a slave) regardless of other protocols. For example, the host 20 (e.g., as a master) to RCD 74 (e.g., as a slave) interface protocol may be either I$^2$C or I$^3$C. In an example, the PMIC 100 may have a 7-bit slave address (e.g., '1001000') assuming that the PID pin of the PMIC 100 is tied to GND on the PCB of the DIMM. The PMIC 100 may support at least four I$^2$C bus commands. For example, the commands may be a Byte Write command, a Byte Read command, a Block Write command and a Block Read command.

Figure 10:
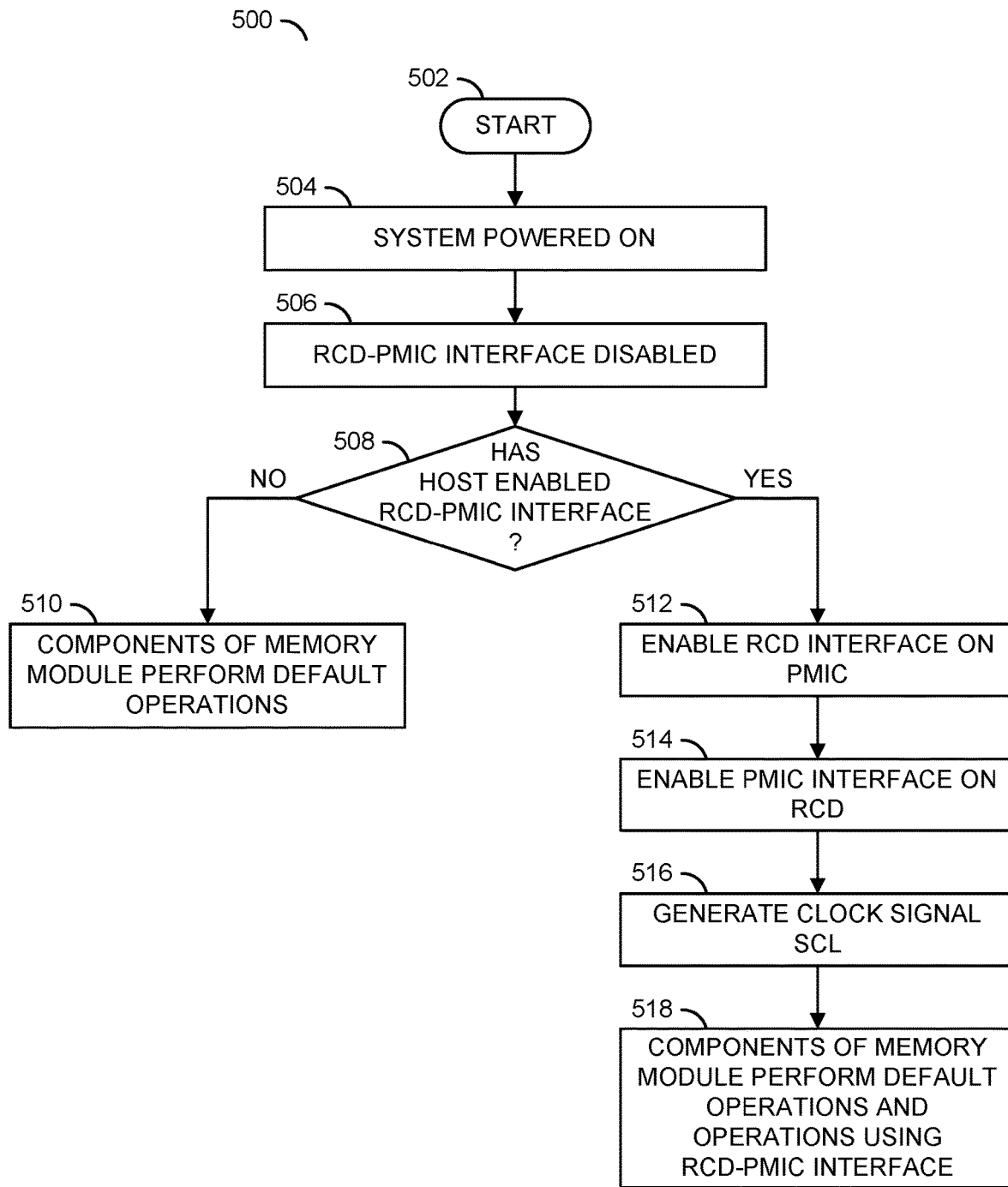
FIG. 10 is a flow diagram illustrating a method for enabling a RCD-PMIC interface.

Referring to FIG. 10, a method (or process) 500 is shown. The method 500 may enable the RCD-PMIC interface 102. The method 500 generally comprises a step (or state) 502, a step (or state) 504, a step (or state) 506, a decision step (or state) 508, a step (or state) 510, a step (or state) 512, a step (or state) 514, a step (or state) 516, and a step (or state) 518.

The step 502 may start the method 500. In the state 504, the system (e.g., the host 20 and/or the memory modules 50a-50n) may be powered on. In the state 506, the RCD-PMIC interface 102 may be disabled (e.g., by default). Next, the method 500 may move to the decision step 508.

In the decision step 508, the host 20 may determine whether or not to enable the RCD-PMIC interface 102. If the host memory controller 20 has not enabled the RCD-PMIC interface 102, the method 500 may move to the step 510. In the step 510, the components of the memory modules 50a-50n (e.g., the RCD 74, the PMIC 100, etc.) may perform default operations. In the decision step 508, if the host memory controller 20 has enabled the RCD-PMIC interface 102, the method 500 may move to the step 512.

In the step 512, the PMIC 100 may enable the RCD interface 220a. In the step 514, the RCD 74 may enable the PMIC interface 190. In an example, the steps 512-514 may be performed in parallel. Next, in the step 516, the RCD 74 may internally generate the clock signal SCL for the RCD-PMIC interface 102. Next, in the step 518, the components of the memory modules 50a-50n may perform the default operations and/or the operations using the RCD-PMIC interface 102.

Figure 11:
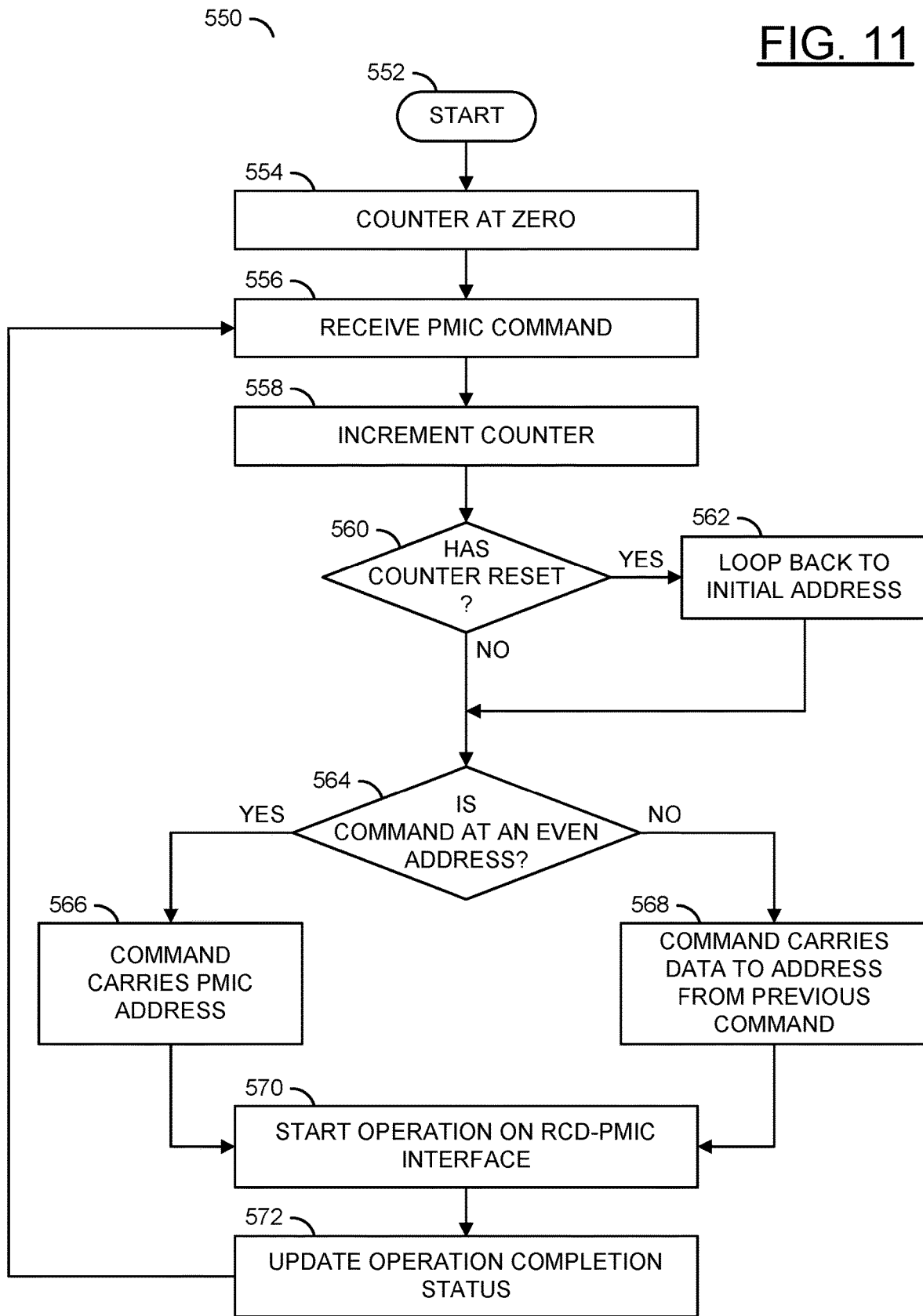
FIG. 11 is a flow diagram illustrating a method for performing a PMIC read/write operation.

Referring to FIG. 11, a method (or process) 550 is shown. The method 550 may perform a PMIC read/write operation. The method 550 generally comprises a step (or state) 552, a step (or state) 554, a step (or state) 556, a step (or state) 558, a decision step (or state) 560, a step (or state) 562, a decision step (or state) 564, a step (or state) 566, a step (or state) 568, a step (or state) 570, and a step (or state) 572.

The step 552 may start the method 550. In the step 554, the counter 196 implemented by the RCD 74 may be at zero (e.g., initialized). Next, in the step 556, the RCD 74 may receive a PMIC command. For example, the RCD 74 may perform similar steps for a PMIC read operation or a PMIC write operation. In the step 558, the RCD 74 may increment the counter 196. Next, the method 550 may move to the decision step 560.

In the decision step 560, the RCD 74 may determine whether the counter 196 has reset (e.g., looped back to zero). If the counter 196 has reset, the method 550 may move to the step 562. In the step 562, the RCD 74 may loop back to the initial address of the pre-defined register space 194. Next, the method 550 may move to the decision step 564. In the decision step 560, if the counter 196 has not reset, the method 550 may move to the decision step 564.

In the decision step 564, the RCD 74 may determine whether the command from the host 20 has been stored at an even address. If the command is stored at an even numbered address, the method 550 may move to the step 566. In the step 566, the RCD 74 may store a command that carries a PMIC address. Next, the method 550 may move to the step 570. In the decision step 564, if the command is stored at an odd numbered address, the method 550 may move to the step 568. In the step 568, the RCD 74 may store a command that carries data to be stored at the address from the previous (e.g., even numbered) command. Next, the method 550 may move to the step 570.

In the step 570, the RCD 74 may start performing the operation (e.g., a read or write) on the RCD-PMIC interface 102. Next, in the step 572, the RCD 74 may update an operation completion status (e.g., update a register when the operation has been completed). Next, the method 550 may return to the step 556.

Figure 12:
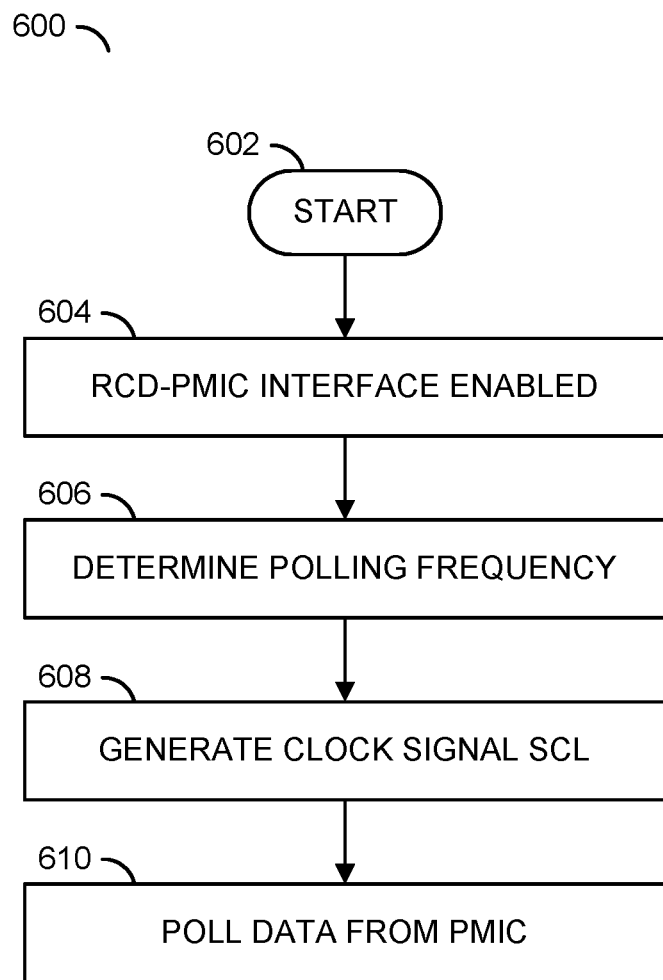
FIG. 12 is a flow diagram illustrating a method for performing a polling operation.

Referring to FIG. 12, a method (or process) 600 is shown. The method 600 may perform a polling operation. The method 600 generally comprises a step (or state) 602, a step (or state) 604, a step (or state) 606, a step (or state) 608, and a step (or state) 610.

The step 602 may start the method 600. In the step 604, the RCD-PMIC interface 102 may be enabled (e.g., the enable command may have been received by the RCD 74 and the PMIC 100 from the host memory controller 20). Next, in the step 606, the RCD 74 may determine the polling frequency (e.g., read from the register PG82RW7E [7:5]). In the step 608, the RCD 74 may internally generate the clock signal SCL. Next, in the step 610, the RCD may perform the polling operations to poll data from the PMIC 100 using the RCD-PMIC interface 102. For example, the RCD 74 may periodically poll the PMIC 100 according to the polling frequency.

Figure 13:
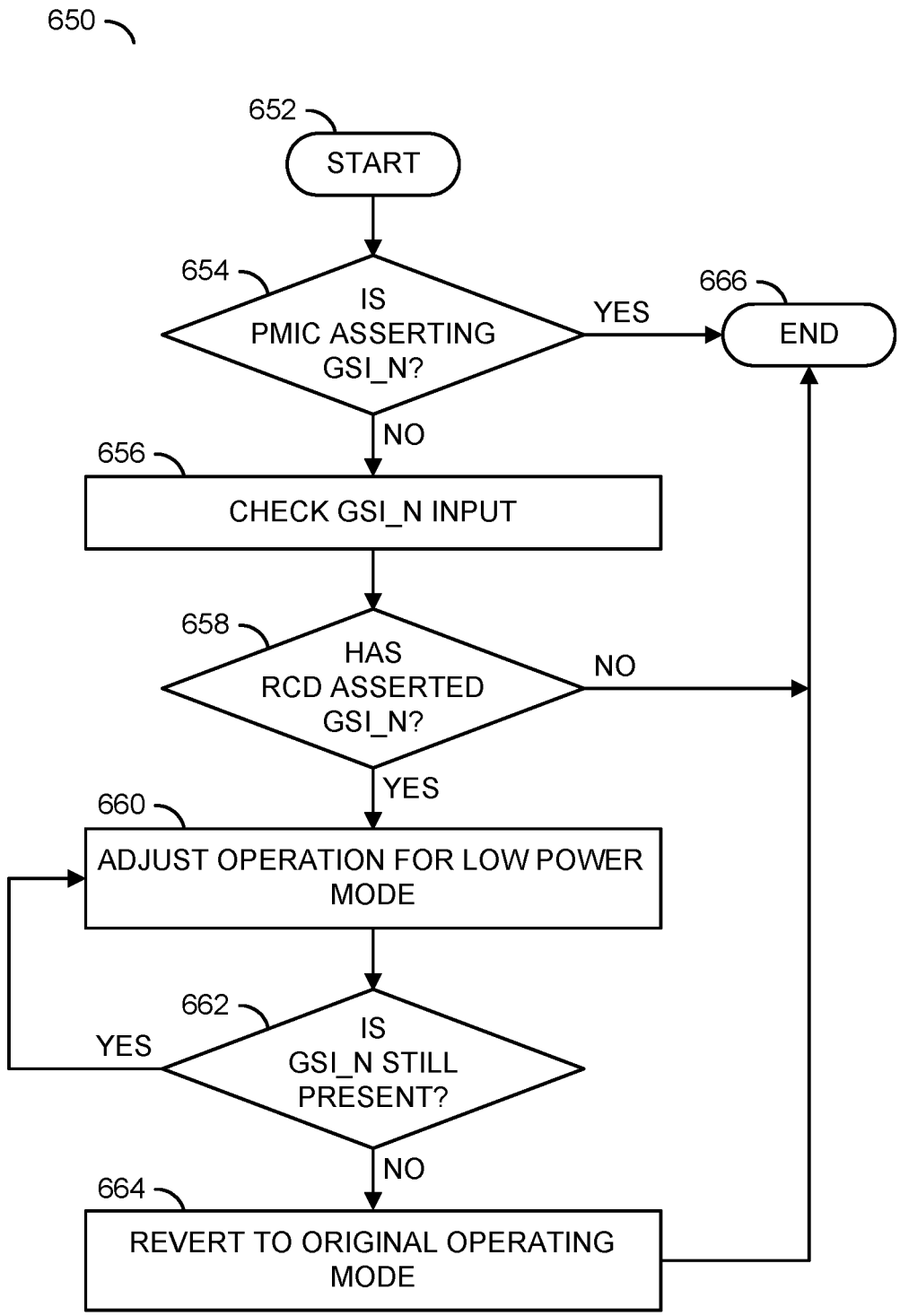
FIG. 13 is a flow diagram illustrating a method for selecting a low power operation mode.

Referring to FIG. 13, a method (or process) 650 is shown. The method 650 may select a low power operation mode. The method 650 generally comprises a step (or state) 652, a decision step (or state) 654, a step (or state) 656, a decision step (or state) 658, a step (or state) 660, a decision step (or state) 662, a step (or state) 664, and a step (or state) 666.

The step 652 may start the method 650. In the decision step 654, the PMIC 100 may determine whether the PMIC 100 is asserting the interrupt signal GSI_N. If the PMIC 100 is asserting the interrupt signal GSI_N, the method 650 may move to the step 666. If the PMIC 100 is not asserting the interrupt signal GSI_N, the method 650 may move to the step 656.

In the step 656, the PMIC 100 may check the GSI_N input 204c. For example, the PMIC 100 may only check the input 204c when the PMIC 100 is not driving the interrupt signal GSI_N low. Next, the method 650 may move to the decision step 658. In the decision step 658, the PMIC 100 may determine whether the RCD 74 has asserted the interrupt signal GSI_N. If not, the method 650 may move to the step 666. If the RCD 74 has asserted the interrupt signal GSI_N, the method 650 may move to the step 660.

In the step 660, the PMIC 100 may adjust the operation for low power mode. Next, the method 650 may move to the decision step 662. In the decision step 662, the PMIC 100 may determine whether the interrupt signal GSI_N is still present (e.g., still being asserted by the RCD 74). If the interrupt signal GSI_N is still present, the method 650 may return to the step 660. If the interrupt signal GSI_N is not present, the method 650 may move to the step 664. In the step 664, the PMIC 100 may revert to the original (e.g., default) operating mode. Next, the method 650 may move to the step 666. The step 666 may end the method 650.

Figure 14:
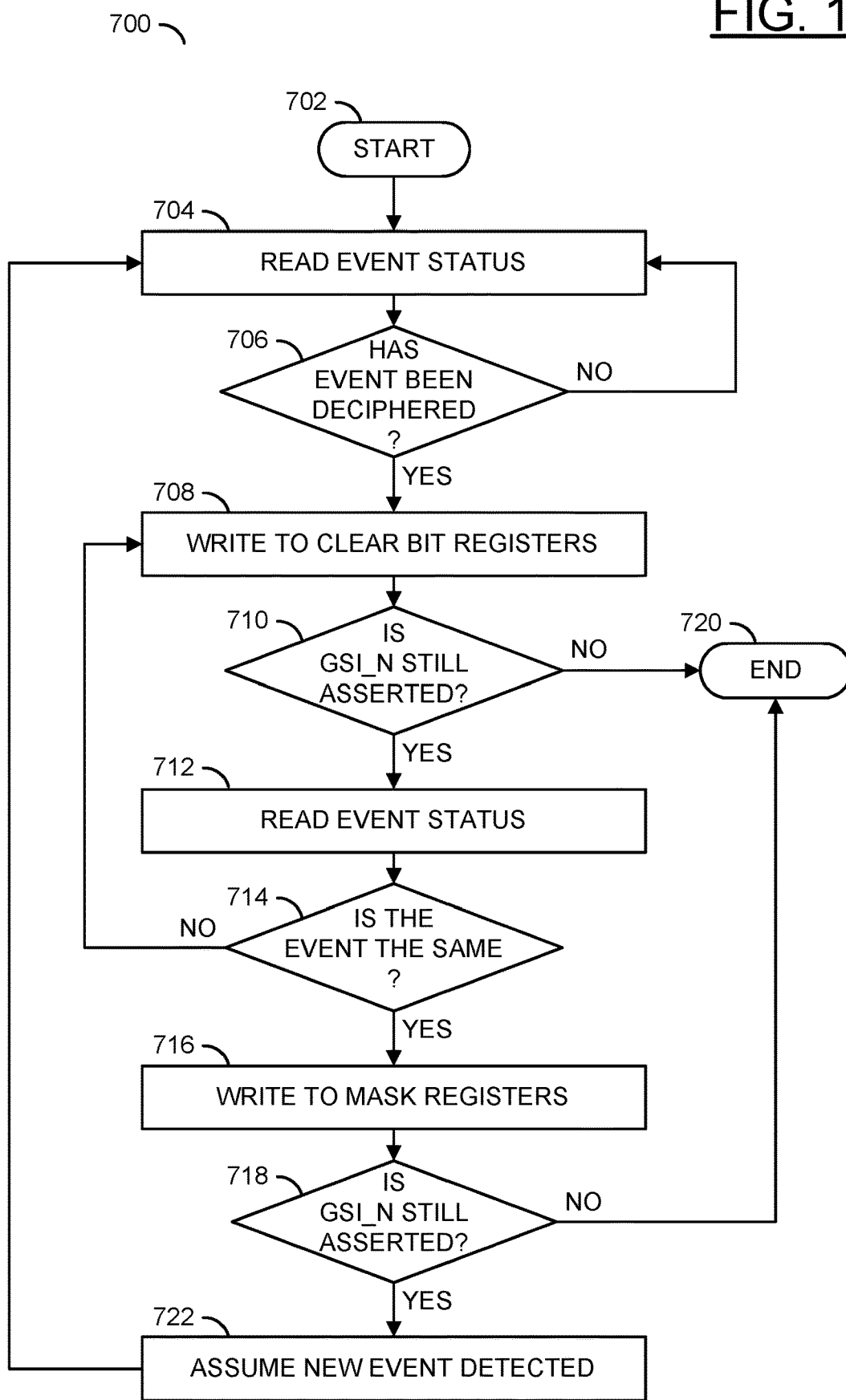
FIG. 14 is a flow diagram illustrating a method for performing a response type to an interrupt signal.

Referring to FIG. 14, a method (or process) 700 is shown. The method 700 may perform a response type to an interrupt signal. The method 700 generally comprises a step (or state) 702, a step (or state) 704, a decision step (or state) 706, a step (or state) 708, a decision step (or state) 710, a step (or state) 712, a decision step (or state) 714, a step (or state) 716, a decision step (or state) 718, a step (or state) 720, and a step (or state) 722.

The step 702 may start the method 700. In the step 704, the RCD 74 may read the event status. Next, the method 700 may move to the decision step 706. In the decision step 706, the RCD 74 may determine whether the interrupt event has been deciphered. If not, the method 700 may return to the step 704. If the event has been deciphered, the method 700 may move to the step 708.

In the step 708, the RCD 74 may write to the clear bit registers. Next, the method 700 may move to the decision step 710. In the decision step 710, the RCD 74 may check the input 170c to determine whether the interrupt signal GSI_N is still being asserted by the PMIC 100. If not, the method 700 may move to the step 720. If the interrupt signal GSI_N is still being asserted, the method 700 may move to the step 712.

In the step 712, the RCD 74 may read the event status. Next, the method 700 may move to the decision step 714. In the decision step 714, the RCD 74 may determine whether the event is still the same. If not, the method 700 may return to the step 708. If the event is still the same, the method 700 may move to the step 716.

In the step 716, the RCD 74 may write to the mask registers. Next, the method 700 may move to the decision step 718. In the decision step 718, the RCD 74 may check the input 170c to determine whether the interrupt signal GSI_N is still being asserted by the PMIC 100. If the interrupt signal GSI_N is still being asserted, the method 700 may move to the step 722. In the step 722, the RCD 74 may assume that the interrupt event indicated by the PMIC 100 is a new event. Next, the method 700 may return to the step 704. In the decision step 718, if the interrupt signal GSI_N is not still asserted, the method 700 may move to the step 720. The step 720 may end the method 700.

Figure 15:
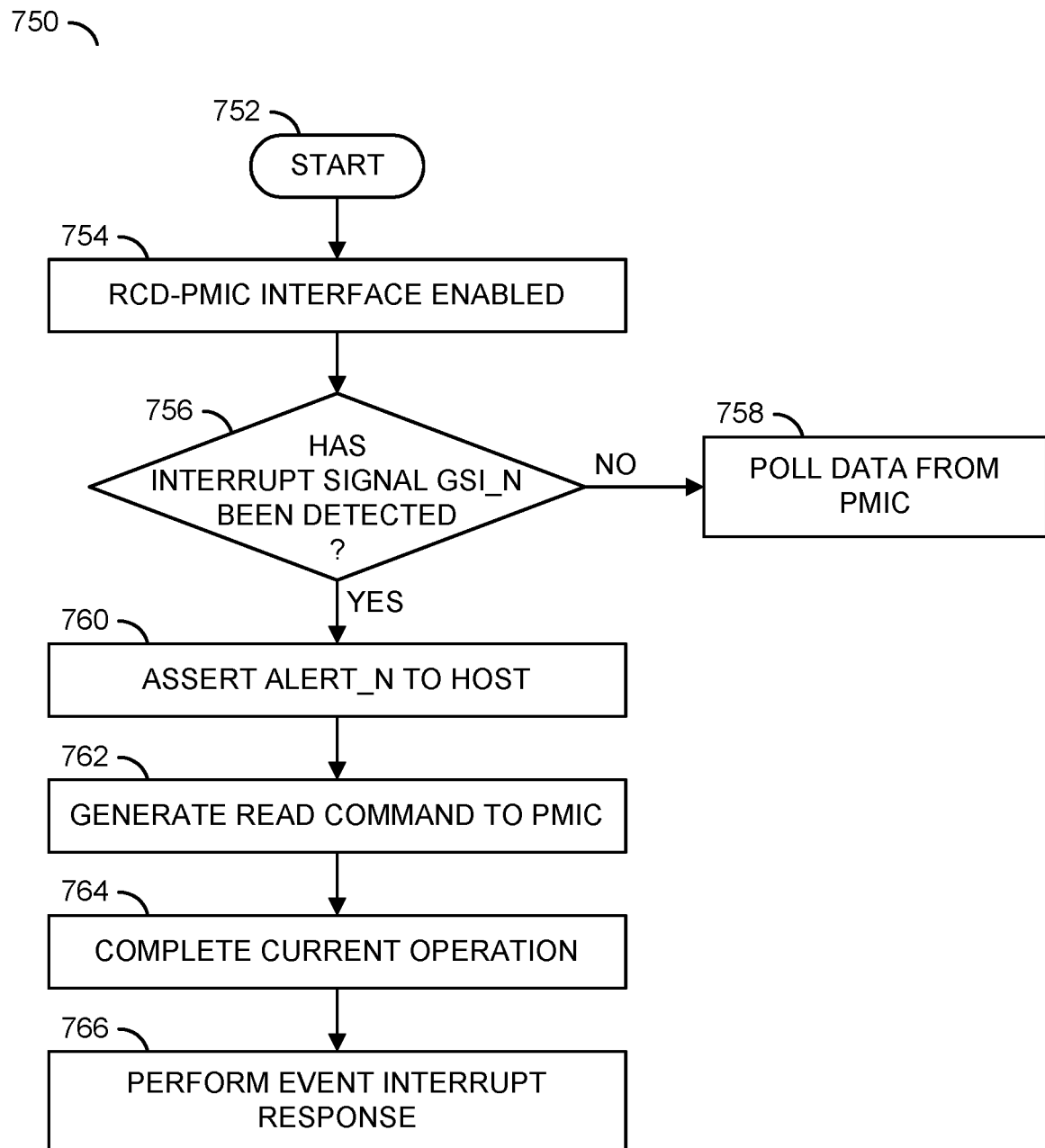
FIG. 15 is a flow diagram illustrating a method for responding to an interrupt event.

Referring to FIG. 15, a method (or process) 750 is shown. The method 750 may respond to an interrupt event. The method 750 generally comprises a step (or state) 752, a step (or state) 754, a decision step (or state) 756, a step (or state) 758, a step (or state) 760, a step (or state) 762, a step (or state) 764, and a step (or state) 766.

The step 752 may start the method 750. In the step 754, the RCD-PMIC interface 102 may be enabled (e.g., the enable command may have been received by the RCD 74 and the PMIC 100 from the host memory controller 20). Next, the method 750 may move to the decision step 756.

In the decision step 756, the RCD 74 may check the input 170c to determine whether the interrupt signal GSI_N has been detected. If not, the method 750 may move to the step 758. In the step 758, the RCD 74 may poll data from the PMIC 100 according to the polling frequency and/or perform default operations (e.g., as shown in association with FIG. 12). In the decision step 756, if the interrupt signal GSI_N has been detected, the method 750 may move to the step 760.

In the step 760, the RCD 74 may assert the signal ALERT_N to the host memory controller 20. Next, in the step 762, the RCD 74 may generate a read command to the PMIC 100 using the RCD-PMIC interface 102. In the step 764, the RCD 74 may complete any current and/or ongoing operation. Next, in the step 766, the RCD 74 may perform the event interrupt response.

Although embodiments of the invention have been described in the context of a DDR5 application, the present invention is not limited to DDR5 applications, but may also be applied in other high data rate digital communication applications where different transmission line effects, cross-coupling effects, traveling wave distortions, phase changes, impedance mismatches and/or line imbalances may exist. The present invention addresses concerns related to high speed communications, flexible clocking structures, specified command sets and lossy transmission lines. Future generations of DDR can be expected to provide increasing speed, more flexibility, additional commands and different propagation characteristics. The present invention may also be applicable to memory systems implemented in compliance with either existing (legacy) memory specifications or future memory specifications.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
  a host interface configured to receive an enable command from a host; and
  a registered clock driver interface configured to (i) perform power management for a dual in-line memory module, (ii) generate power measurement data about said dual in-line memory module, (iii) communicate said power measurement data to a registered clock driver using a bi-directional bus, (iv) receive a clock signal and (v) communicate an interrupt signal, wherein (a) said registered clock driver interface is disabled at power on, (b) said registered clock driver interface is enabled in response to said enable command, (c) said clock signal is independent from a host clock of said dual in-line memory module, (d) said power management is adjusted in response to an input from said registered clock driver using said bi-directional bus and (e) said apparatus is implemented as a component on a circuit board along with said dual in-line memory module to provide said power measurement data to said registered clock driver without impacting latency on a system bus by using said clock signal independent from said host clock to enable said registered clock driver to read said power measurement data and provide said input regardless of a state of said host clock.

2. The apparatus according to claim 1, wherein said apparatus implements a power management integrated circuit (PMIC).

3. The apparatus according to claim 1, wherein said power measurement data comprises a power measurement readout, a current consumption measurement readout, a status of said apparatus, a temperature readout.

4. The apparatus according to claim 1, wherein said power measurement data is communicated to a pre-defined register space in said registered clock driver.

5. The apparatus according to claim 1, wherein said clock signal (i) is internally generated by said registered clock driver and (ii) operates independently from said host clock.

6. The apparatus according to claim 1, wherein said registered clock driver interface is configured to enable bi-directional communication of said power measurement data.

7. The apparatus according to claim 1, wherein said registered clock driver interface is configured to enable periodic polling of said power measurement data by said registered clock driver.

8. The apparatus according to claim 1, further comprising a register space configured to (i) store said power measurement data and (ii) store write operations forwarded by said registered clock driver from said host.

9. The apparatus according to claim 1, wherein said apparatus is further configured to enable a memory controller of said host to have direct access to said power measurement data.

10. The apparatus according to claim 1, wherein said registered clock driver interface implements a master $I^2C$ protocol.

11. The apparatus according to claim 1, wherein said apparatus is configured using a JEDEC standard pinout in addition to (i) a pin for said power measurement data and said input, (ii) a pin for said clock signal and (iii) a pin for said interrupt signal.

12. The apparatus according to claim 1, wherein said registered clock driver interface reduces an amount of bandwidth in a host bus used by said dual in-line memory module.

13. The apparatus according to claim 1, wherein said registered clock driver interface reduces a readout time latency of said power measurement data compared to using a host bus.

14. The apparatus according to claim 1, wherein said apparatus is configured to adjust memory access patterns of a plurality of memory chips within said dual in-line memory module.

15. The apparatus according to claim 1, wherein (i) said registered clock driver is configured to perform (a) reading registers and (b) a response type when said interrupt signal is received and (ii) said response type comprises (a) no response in a first mode, (b) masking a register and waiting for said host to decide in a second mode and (c) clearing said register in a third mode.

16. The apparatus according to claim 1, wherein said apparatus reacts to a lower power state of said dual in-line memory module in response to receiving said interrupt signal.

17. The apparatus according to claim 1, wherein said apparatus generates said interrupt signal to enable said registered clock driver to respond to an event detected by said apparatus.

18. The apparatus according to claim 1, wherein said dual in-line memory module is implemented according to a double data rate fifth-generation synchronous dynamic random-access memory (DDR5 SDRAM) standard.

19. The apparatus according to claim 1, wherein (i) said host interface implements at least one of an $I^2C$ bus and an $I^3C$ bus and (ii) said enable command is a VR Enable command.

20. The apparatus according to claim 1, wherein said apparatus is implemented on said dual in-line memory module to reduce congestion on said system bus.

* * * * *